US011750144B2

(12) United States Patent
Sawada

(10) Patent No.: US 11,750,144 B2
(45) Date of Patent: Sep. 5, 2023

(54) INDOOR STRUCTURE

(71) Applicant: KANEKA CORPORATION, Osaka (JP)

(72) Inventor: Toru Sawada, Osaka (JP)

(73) Assignee: KANEKA CORPORATION, Osaka (JP)

(*) Notice: Subject to any disclaimer, the term of this patent is extended or adjusted under 35 U.S.C. 154(b) by 176 days.

(21) Appl. No.: 17/419,376

(22) PCT Filed: Oct. 28, 2019

(86) PCT No.: PCT/JP2019/042151
§ 371 (c)(1),
(2) Date: Jun. 29, 2021

(87) PCT Pub. No.: WO2020/144916
PCT Pub. Date: Jul. 16, 2020

(65) Prior Publication Data
US 2022/0085750 A1 Mar. 17, 2022

(30) Foreign Application Priority Data

Jan. 10, 2019 (JP) .................. 2019-002792

(51) Int. Cl.
H02S 20/26 (2014.01)
H02S 40/34 (2014.01)
(Continued)

(52) U.S. Cl.
CPC ............... *H02S 20/26* (2014.12); *E06B 7/28* (2013.01); *H02S 40/34* (2014.12); *H02S 40/36* (2014.12)

(58) Field of Classification Search
CPC ........................................ H02S 20/26
See application file for complete search history.

(56) References Cited

U.S. PATENT DOCUMENTS

2008/0236654 A1   10/2008   Pietrangelo et al.
2012/0210658 A1   8/2012    Logan
(Continued)

FOREIGN PATENT DOCUMENTS

CN   107154440 A   *   9/2017
JP   2001-098856 A       4/2001
(Continued)

OTHER PUBLICATIONS

English machine translation of Jiang (CN-107154440-A) provided by the EPO website, 2023, All Pages. (Year: 2023).*

(Continued)

Primary Examiner — Daniel P Malley, Jr.
(74) Attorney, Agent, or Firm — Studebaker & Brackett PC

(57) ABSTRACT

The present invention provides an indoor structure in which a wire to a solar cell module is hardly visible and design is improved. In an indoor structure, a solar cell module is attached to a window disposed between a ceiling and a floor. The ceiling has a first ceiling part, and a second ceiling part continuous with the first ceiling part via a vertical wall part on a lower side than the first ceiling part, the window has a window glass including a window main surface, the solar cell module has a main body panel and an extraction wire, the main body panel is obtained by arranging solar cells between two translucent substrates, and is capable of transmitting light in a thickness direction, the main body panel includes a panel main surface, and the panel main surface faces the window main surface of the window, the extraction wire extends inside and outside the main body panel, and includes a first end part, the first end part of the extraction wire is electrically connected to the solar cells within the main body panel, the extraction wire has a wire part exposed (Continued)

from the main body panel, and the wire part is laid between the vertical wall and the window.

11 Claims, 19 Drawing Sheets

(51) Int. Cl.
    *H02S 40/36*     (2014.01)
    *E06B 7/28*     (2006.01)

(56) References Cited

U.S. PATENT DOCUMENTS

| 2015/0295534 | A1 | 10/2015 | Maruyama et al. | |
| 2020/0395885 | A1* | 12/2020 | Janowski | E06B 3/4415 |

FOREIGN PATENT DOCUMENTS

| JP | 2009-024415 | A | | 2/2009 |
| JP | 2012-140767 | A | | 7/2012 |
| JP | 2014-175402 | A | | 9/2014 |
| JP | 2016-186156 | A | | 10/2016 |
| JP | 6249176 | B2 | | 12/2017 |
| KR | 2011-0139382 | A | * | 12/2011 |
| WO | 2014/118840 | A1 | | 8/2014 |

OTHER PUBLICATIONS

English machine translation of Jang et al. (KR-2011-0139382-A) provided by the EPO website, 2023, All Pages. (Year: 2023).*
Supplementary Partial European Search Report issued by the European Patent Office in European Patent Application No. 19909315.4 which is related to U.S. Appl. No. 17/419,376; date of completion of the search: Dec. 15, 2022.
International Preliminary Report on Patentability and Written Opinion issued in PCT/JP2019/042151; dated Jun. 16, 2021.

* cited by examiner

A-A CROSS-SECTIONAL VIEW

B-B CROSS-SECTIONAL VIEW

INDOOR STRUCTURE

TECHNICAL FIELD

The present invention relates to an indoor structure in which a solar cell module is provided in a window of an office or the like.

BACKGROUND ART

In facilities such as offices, as countermeasures against warmth in the summer and coldness in the winter, multiple windows in which window glasses are provided in multiple layers are adopted in order to insulate between an outside air and an inside air. However, in order to provide existing fitting windows in multiple layers, since it is necessary to detach all the existing windows and attach new multiple windows again, a work has become large.

Thus, in recent years, a multilayer glass window in which a glass plate faces an existing window glass with a spacer interposed therebetween and is bonded by a seal member has been developed (for example, Patent Document 1).

In accordance with the multilayer glass window described in Patent Document 1, since the glass plate is attached to the existing window glass, it is possible to provide multilayer windows without requiring a large-scale construction for the existing fitting window.

PRIOR ART DOCUMENT

Patent Document

Patent Document 1: JP 2012-140767 A

DISCLOSURE OF INVENTION

Technical Problem

Incidentally, in recent years, there is an increasing demand for solar power generation using an outer wall and a window in order to promote a Zero Energy Building (ZEB) of a high-rise building and a large commercial facility. In general, in a solar cell module, a solar cell is sealed with a glass plate, and a transparent conductive film or a metal film is used as an electrode.

Thus, the present inventor has considered that both heat insulation of a window and solar power generation can be simultaneously realized by providing a gap inside an existing window glass and installing a solar cell module to form a multilayer according to Patent Document 1.

However, when the window glass is altered to multilayer type by using the solar cell module, a wire for collecting generated electricity is provided in the solar cell module, and the wire of the solar cell module is exposed to an indoor side. Thus, there are problems that the wire is visually recognized from the indoor side and the appearance of an indoor space deteriorates.

Therefore, an object of the present invention is to provide an indoor structure in which a wire to a solar cell module is hardly visible and the design is improved.

Solution to Problem

An aspect of the present invention for solving the above problems is an indoor structure that includes a solar cell module attached to a window disposed between a ceiling and a floor, wherein the ceiling includes a first ceiling part and a second ceiling part, the second ceiling part being located lower than the first ceiling part, the second ceiling part being continuous with the first ceiling part via a vertical wall part, wherein the window includes a window glass having a window main surface, wherein the solar cell module includes a main body panel and an extraction wire, wherein the main body panel includes two translucent substrates and solar cells arranged therebetween, the main body panel being configured to transmit light in a thickness direction of the main body panel, wherein the main body panel includes a panel main surface facing the window main surface, wherein the extraction wire extends inside and outside the main body panel, the extraction wire including a first end part, wherein the first end part is electrically connected to the solar cells inside the main body panel, wherein the extraction wire includes a wire part exposed from the main body panel, and wherein the wire part is laid between the vertical wall and the window.

In accordance with the present aspect, since the wire part which is an exposed part of the extraction wire from the solar cell module is laid between the vertical wall part of the ceiling and the window, the extraction wire is hidden by the vertical wall part, and the extraction wire is hardly visible from the indoor space side.

In a preferable aspect, the wire part has a thickness thinner than a width, and is laid between the vertical wall part and the window so that a thickness direction crosses the first ceiling part.

In accordance with the present aspect, the extraction wire is more hardly visible.

In a preferable aspect, a spacing holding member is provided between the window main surface (one main surface of the window glass) and the panel main surface (one main surface of the main body panel), and a spacing between the window main surface and the panel main surface is 5 mm or more and 50 mm or less.

In accordance with the present aspect, since there is an appropriate space between the window and the main body panel, heat can be insulated by a gas such as air in the space, and a heat insulating effect can be further exhibited. In accordance with the present aspect, the main body panel does not protrude too much with respect to the window and is hard to be bulky.

In a preferable aspect, the main body panel includes a plurality of solar cell strings, a positive electrode side connecting part, and a negative electrode side connecting part, wherein the solar cell string includes a plurality of solar cells connected in series, wherein the positive electrode side connecting part is electrically connected to positive electrode side end parts of the solar cell strings, wherein the negative electrode side connecting part is electrically connected to negative electrode side end parts of the solar cell strings, wherein the extraction wire includes a positive electrode side wire part and a negative electrode side wire part at the first end part, and wherein between the two translucent substrates, each of the positive electrode side wire part is connected to the positive electrode side connecting part, and each of the negative electrode side wire part is connected to the negative electrode side connecting part.

In accordance with the present aspect, the positive electrode side end part of each solar cell string is connected to the positive electrode side wire part of the extraction wire via the positive electrode side connecting part, and the negative electrode side end part of each solar cell string is connected to the negative electrode side wire part of the extraction wire via the negative electrode side connecting part. That is, since the solar cell strings are electrically connected in parallel, power can be generated even though one solar cell string is damaged. Construction and maintenance are also facilitated.

In a more preferable aspect, the extraction wire includes a second wire part including the positive electrode side wire part and the negative electrode side wire part, and the second wire part is composed of bundled conductors.

In accordance with the present aspect, even though a part of the conductors is disconnected, the remaining conductors can maintain the function of the wire.

In a preferable aspect, the indoor structure further included a cover member with a recessed section, wherein the cover member is attached to at least one attachment target selected from the group consisting of the window, the first ceiling part, and the main body panel, and wherein the recessed section surrounds the wire part together with the attachment target.

In accordance with the present aspect, since the extraction wire is surrounded by the cover member and the attachment target, the extraction wire is hidden by the cover member when viewed from the indoor space side, the extraction wire is hardly visible, and safety against electric shock can be improved.

In a more preferable aspect, the solar cell module includes a terminal box to which the wire part is connected, and the cover member includes the terminal box therein.

In accordance with the present aspect, since the terminal box is hidden by the cover member, the terminal box is hardly visible, and the design is excellent.

In a preferable aspect, the wire part has a thickness thinner than a width, a part of the wire part being inserted into the main body panel, and a thickness direction of the wire part substantially coincides with an overlapping direction of the two translucent substrates inside the main body panel.

The "thickness direction of the wire part substantially coincides with the overlapping direction of the two translucent substrates" mentioned herein means that an absolute value of an inclination angle of the wire part in the thickness direction with respect to the overlapping direction of the two translucent substrates is 3 degrees or less.

In accordance with the present aspect, a part of the wire part is inserted into the main body panel, and the thickness direction of the wire part substantially coincides with the overlapping direction of the two translucent substrates. Thus, the wire part can be inserted into the main body panel without deteriorating a sealing property.

Incidentally, in a large room such as a conference room, there is a case where lighting is performed by a plurality of fitting windows, and a column member such as a frame for fixing the window or a through-column for securing wall strength is provided between the windows. Since such a column member generally protrudes from a wall surface on which the window is provided toward the indoor space, when the solar cell module is attached to each window, it is necessary to provide a wire across the column member protruding from the window to electrically connect the solar cell modules. Thus, the wire may be directly exposed, the appearance may be poor, and a risk of electric shock or the like may occur.

Thus, in a preferable aspect, the indoor structure further including: at least two windows; a column member positioned between the two windows; at least two of the solar cell modules; and a second cover member with a recessed section, wherein the two solar cell modules are configured to arrange the panel main surfaces to face the window main surfaces respectively, wherein the two solar cell modules are electrically connected by the extraction wire, wherein the wire part is disposed along an outer surface of the column member, and wherein the second cover member includes a part of the wire part in the recessed section.

In accordance with the present aspect, since the wire part is accommodated by the second cover member, the wire part is hardly visible by the second cover member, and a risk of electric shock or the like can be prevented.

In a more preferable aspect, the column member is a through-column.

Another aspect of the present invention is an indoor structure including: at least two windows arranged along a wall; a column member positioned between the two windows; at least two solar cell modules; and a second cover member with a recessed section, wherein the window includes a window glass having a window main surface, wherein the solar cell module includes a main body panel with a panel main surface, and an extraction wire, wherein the panel main surface of each of the main body panel (one main surface) is configured to face the window main surface of each of the window (one main surface of the window glass), wherein the two solar cell modules are electrically connected by the extraction wire, wherein the extraction wire includes a wire part exposed from the main body panel, wherein the wire part extends along an outer surface of the column member, and wherein the second cover member is attached to the column member, and includes the wire part in the recessed section.

In accordance with the present aspect, since the wire part is accommodated by the second cover member, a risk of electric shock or the like can be prevented. Since a part of the wire part is hidden by the second cover member, the wire part is hardly visible from the indoor space side.

Effect of Invention

In accordance with the indoor structure of the present invention, the wire to the solar cell module is hardly visible, and design is improved.

BRIEF DESCRIPTION OF DRAWINGS

FIG. 5A is a cross-sectional view taken along a line A-A of FIG. 1, and FIG. 5B is a cross-sectional view taken along a line B-B of FIG. 1.

FIG. 12A is a perspective view of a first cover member, and FIG. 12B is a perspective view of the second cover member.

FIG. 13A is a perspective view when the solar cell module is overlapped on a fitting window, and FIG. 13B is a perspective view when the solar cell module is temporarily fixed by a positioning member.

FIG. 14A is a perspective view illustrating a state in which the solar cell module is temporarily fixed by the positioning member, and FIG. 14B is a perspective view illustrating a situation in which an adhesive is applied along an edge of the solar cell module.

BEST MODE FOR CARRYING OUT THE INVENTION

Hereinafter, embodiments of the present invention will be described in detail.

Figure 1:
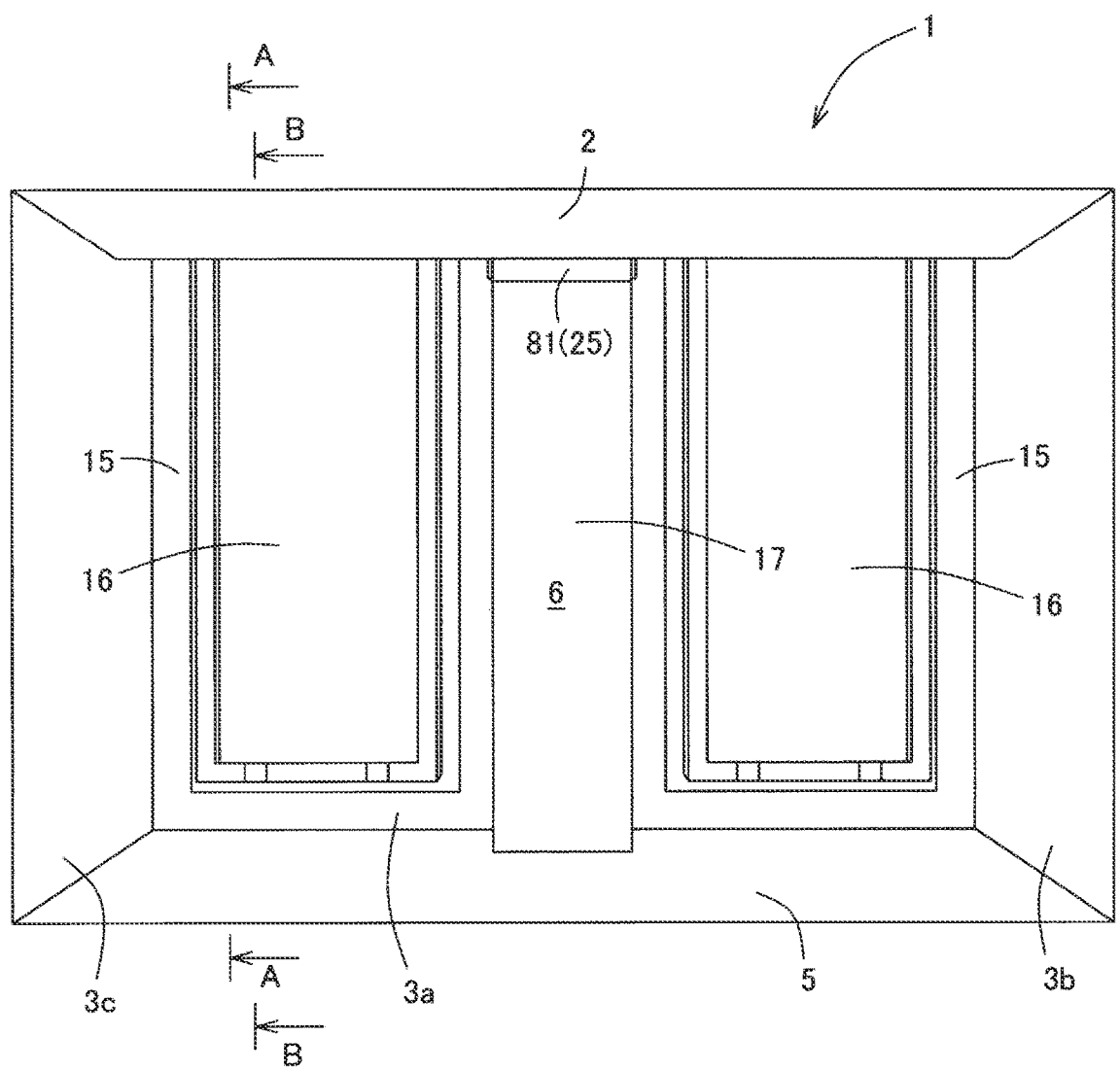
FIG. 1 is a perspective view schematically illustrating an indoor structure according to a first embodiment of the present invention.

An indoor structure 1 according to a first embodiment of the present invention constitutes a room of a building such as an office. As illustrated in FIG. 1, the indoor structure 1 includes a ceiling 2, walls 3a to 3c, and a floor 5, and an indoor space 6 is constituted by the ceiling 2, the walls 3a to 3c, and the floor 5.

Figure 2:
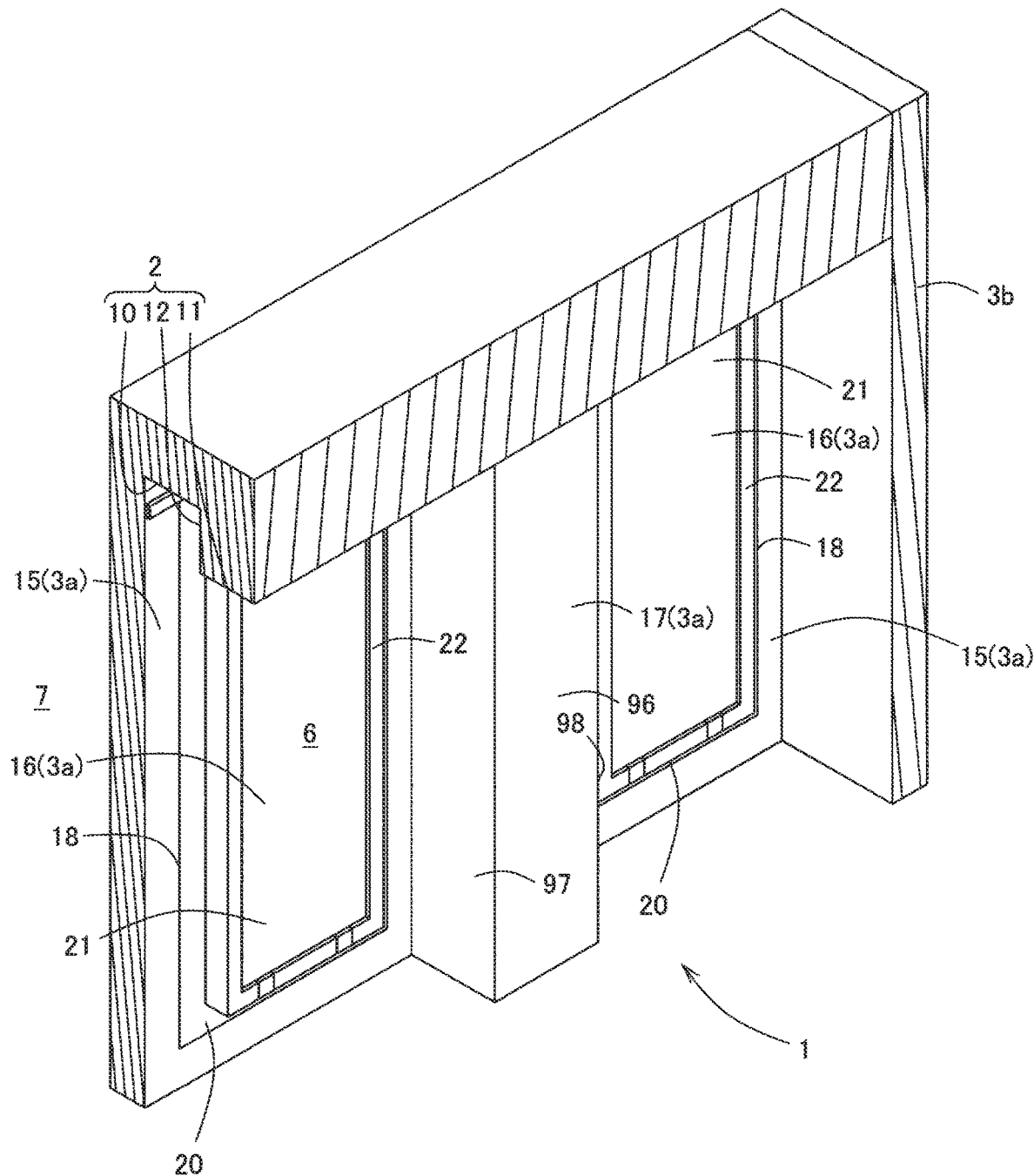
FIG. 2 is a sectional perspective view of the indoor structure of FIG. 1 as viewed from above.
Figure 3:
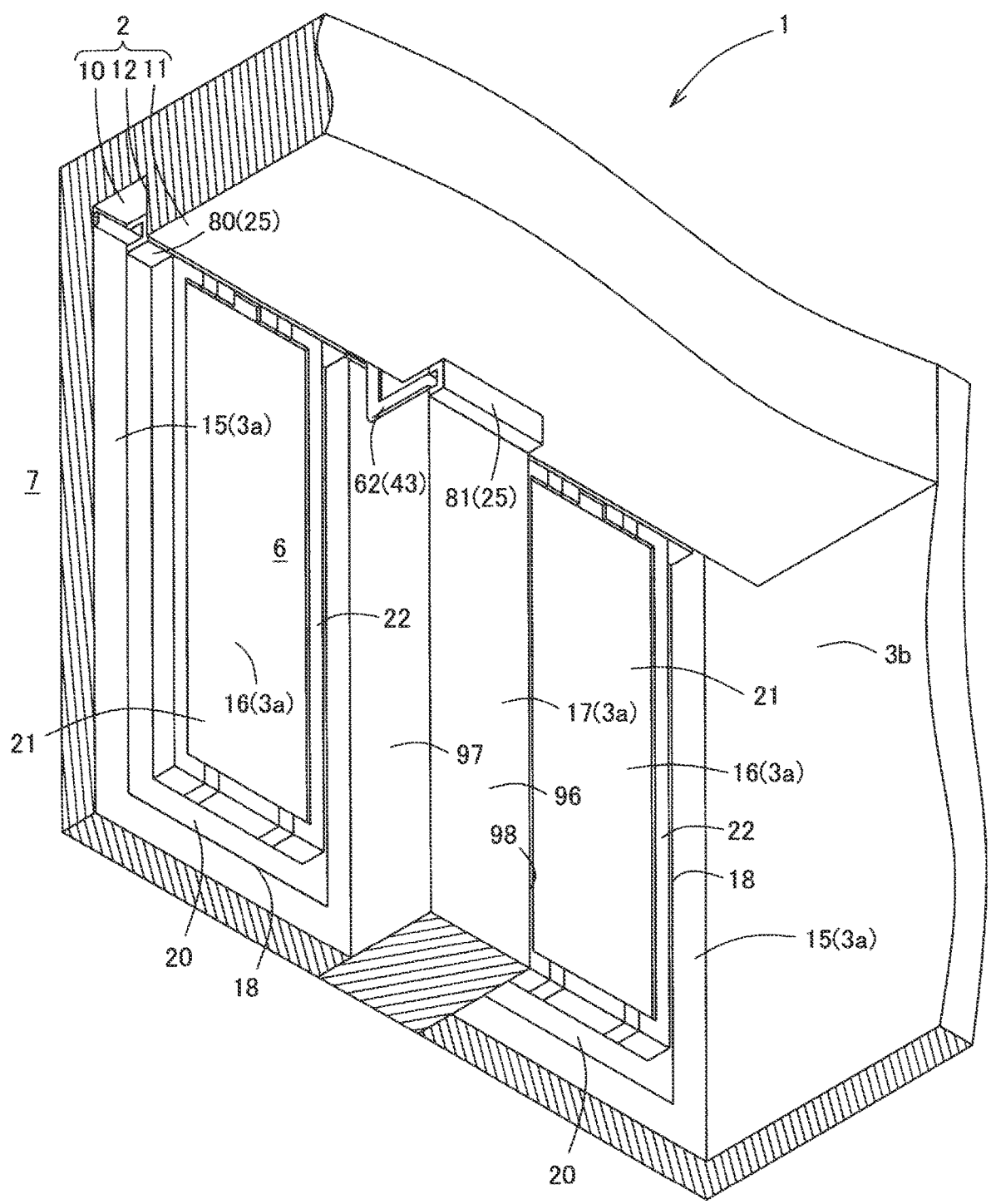
FIG. 3 is a sectional perspective view of the indoor structure of FIG. 1 as viewed from below.

As illustrated in FIGS. 2 and 3, the ceiling 2 includes a first ceiling part 10, a second ceiling part 11, and a vertical wall part 12, and the first ceiling part 10 is stepwise continuous with the second ceiling part 11 via the vertical wall part 12.

The first ceiling part 10 is a part constituting a ceiling surface together with the second ceiling part 11, and is a part positioned on a side closer to the wall 3a than the second ceiling part 11.

The second ceiling part 11 is a part positioned on a lower side than the first ceiling part 10 and having a step with respect to the first ceiling part 10.

The vertical wall part 12 is a wall part connecting an end part of the first ceiling part 10 and an end part of the second ceiling part 11, and is a wall part hanging down from the first ceiling part 10 toward the second ceiling part 11.

Figure 4:
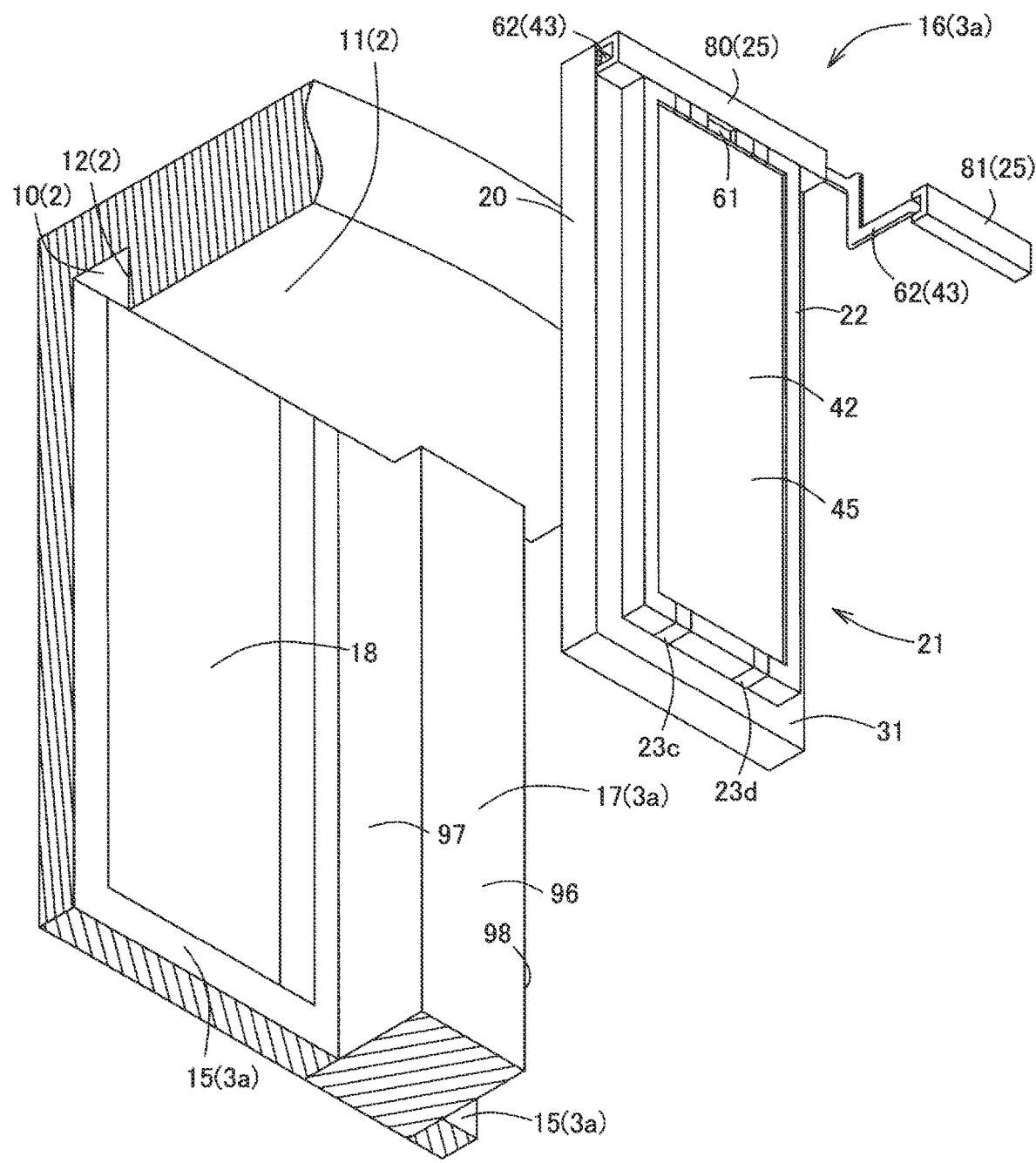
FIG. 4 is an exploded perspective view of the indoor structure of FIG. 3.

As illustrated in FIGS. 2 to 4, the wall 3a that separates the indoor space 6 from an outdoor space 7 includes, as main constituting parts, a wall surface constituting part 15, power generation windows 16, and a column member 17.

As shown in FIG. 1, the wall surface constituting part 15 is a vertical wall erected from the floor 5 and extending in an up and down directions.

Figure 6:
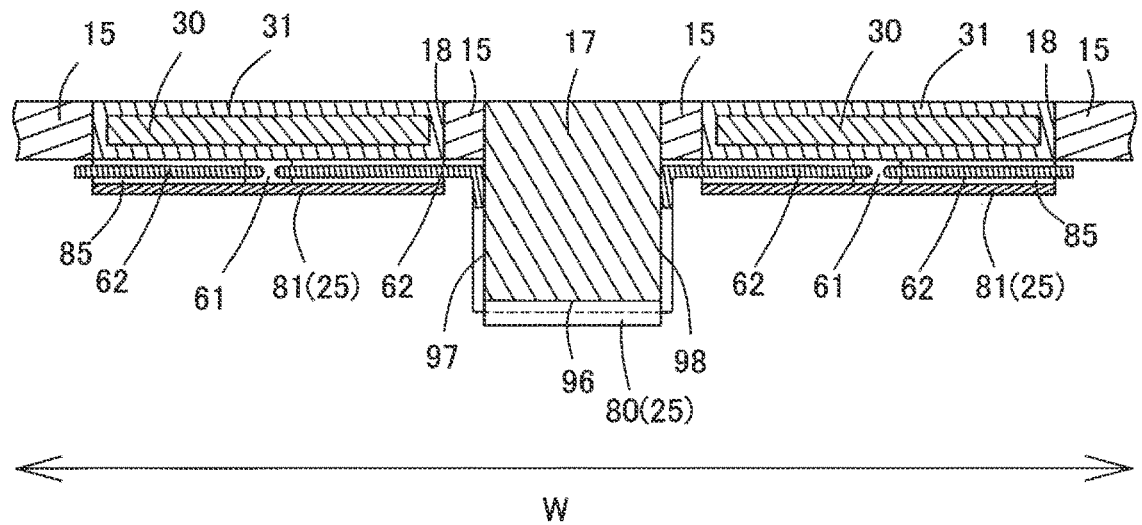
FIG. 6 is a transverse cross-sectional view of the indoor structure of FIG. 1.

As can be seen from FIGS. 3, 4, and 6, the wall surface constituting part 15 includes a plurality of openings 18, and at least two openings 18 and 18 are provided to sandwich the column member 17 in a width direction W (left-right direction).

As shown in FIG. 4, the power generation window 16 is attached to the opening 18 of the wall surface constituting part 15, and has a lighting function as a window and a power generation function as a solar cell.

Figure 5A:
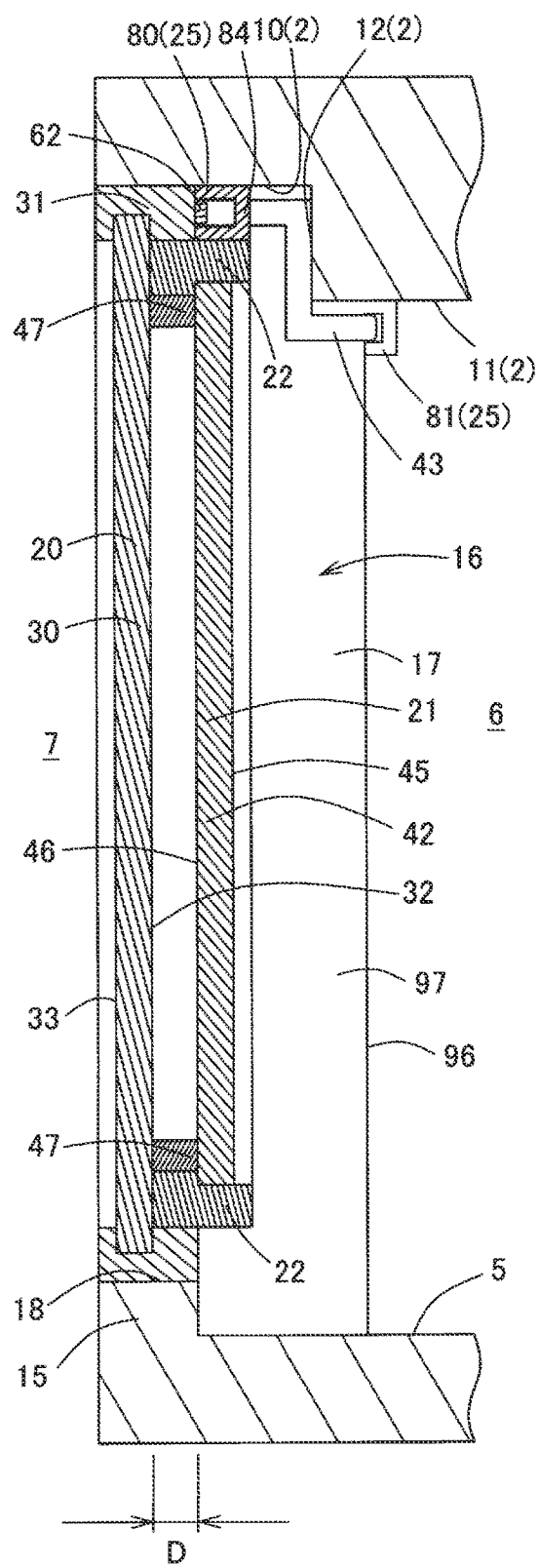
FIGS. 5A and 5B are longitudinal cross-sectional views of the indoor structure of FIG. 1.
Figure 5B:
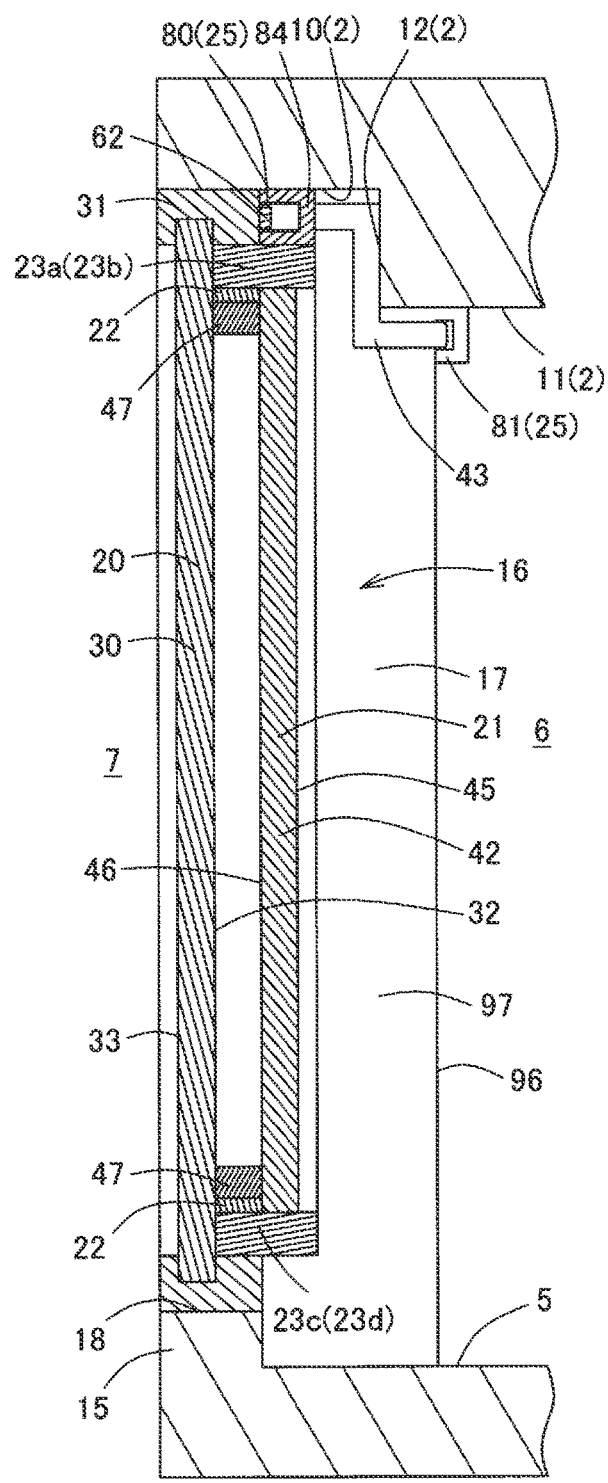
Figure 8:
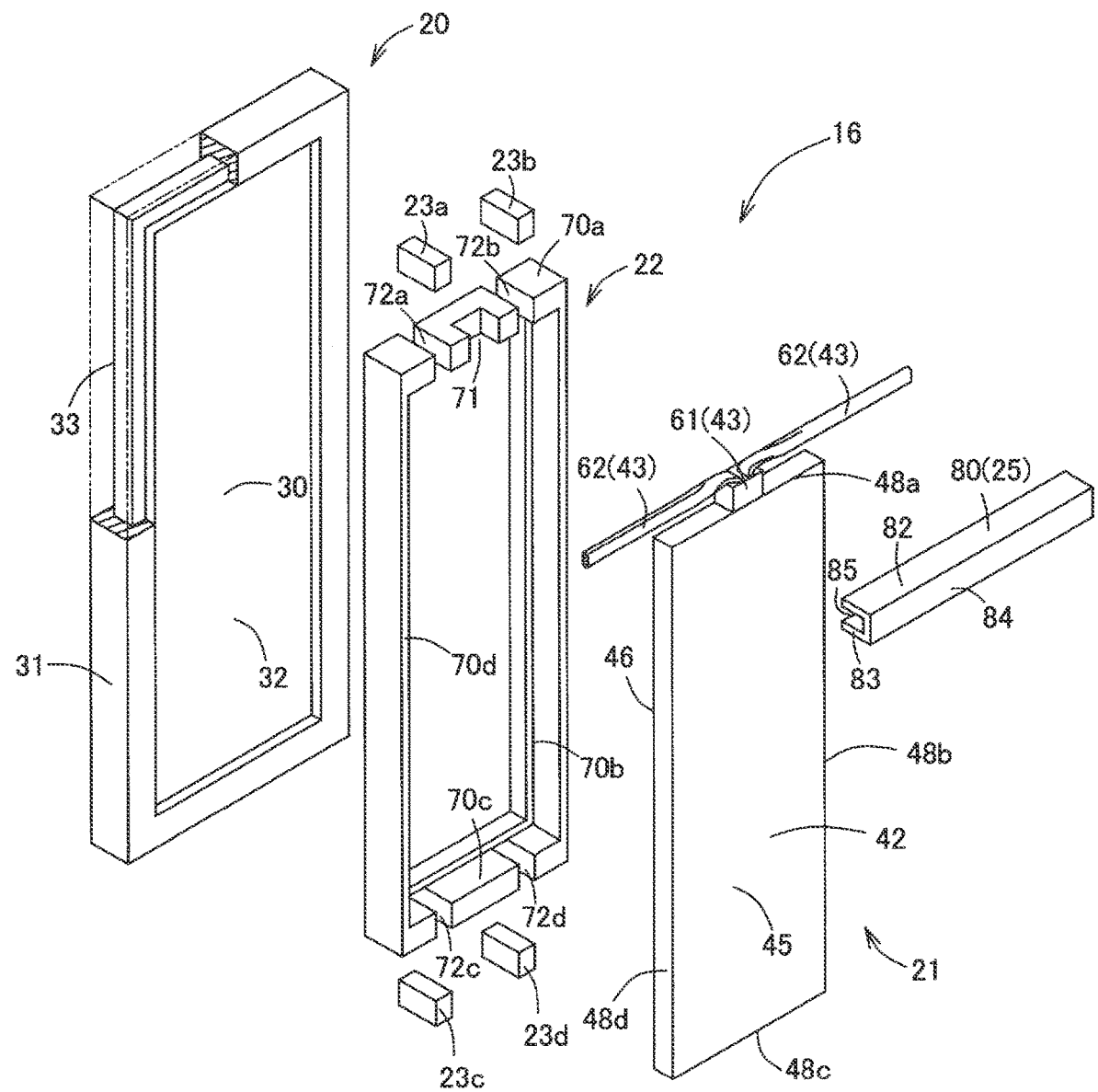
FIG. 8 is an exploded perspective view of a power generation window of FIG. 4, in which a second cover member is omitted.

As shown in FIG. 8, the power generation window 16 includes, as main constituting parts, a fitting window 20, a solar cell module 21, a bonding member 22, positioning members 23a to 23d, and a protective member 25 (see FIGS. 5A and 5B).

As can be seen from FIGS. 4 and 8, the fitting window 20 is a window that is fitted into the opening 18 of the wall surface constituting part 15 and is inseparably integrated with the wall surface constituting part 15. That is, the fitting window 20 is attached to the wall surface constituting part 15 with an adhesive (not illustrated) or the like, and cannot be detached from the wall surface constituting part 15 as long as an adhesion part with the adhesive or the like is not peeled off (not broken).

As shown in FIG. 8, the fitting window 20 includes a window glass 30 and a frame 31.

The window glass 30 is a plate-like body having translucent properties, and the window glass 30 according to the present embodiment is a glass plate having a quadrangular shape when viewed from the front.

The window glass 30 is fixed in a vertical posture via the frame 31, and has two main surfaces that are a main surface on the indoor space 6 side (hereinafter, also referred to as an inner main surface 32) (window main surface) and a main surface on the outdoor space 7 side (hereinafter, also referred to as an outer main surface 33).

As shown in FIG. 8, the frame 31 is a member that holds a part or all of sides of the window glass 30 and protects an end surface of the window glass 30. The frame 31 is also a member that fixes the window glass 30 to the opening 18 of the wall surface constituting part 15.

The frame 31 has a quadrangular annular shape when viewed from the front, and has lighting openings on the front and back, respectively.

As shown in FIG. 8, the solar cell module 21 includes a main body panel 42 and extraction wire 43.

The main body panel 42 is a see-through solar cell panel, and is capable of transmitting light in a thickness direction. That is, the main body panel 42 includes power generation parts that receive light and generates power and lighting parts that transmit the light in the thickness direction, and the power generation parts can generate the power by photoelectrically converts the light emitted from the outdoor space 7, and the lighting parts can transmit the light to the indoor space 6. In the main body panel 42, a part or all of the power generation parts may also serve as the lighting parts.

The main body panel 42 according to the present embodiment is a solar cell panel having a light-receiving surface on one side. The main body panel 42 may be a double-sided light receiving type solar cell panel having light-receiving surfaces on both sides.

As illustrated in FIGS. 5A and 5B, the main body panel 42 has a main surface on the indoor space 6 side (hereinafter, also referred to as an inner main surface 45) and a main surface on the outdoor space 7 side (hereinafter, also referred to as an outer main surface 46) (panel main surface), and the outer main surface 46 is the light-receiving surface.

As shown in FIG. 8, the main body panel 42 according to the present embodiment is a quadrangular plate-like panel when viewed from the front, and includes four sides 48a to 48d.

Figure 9:
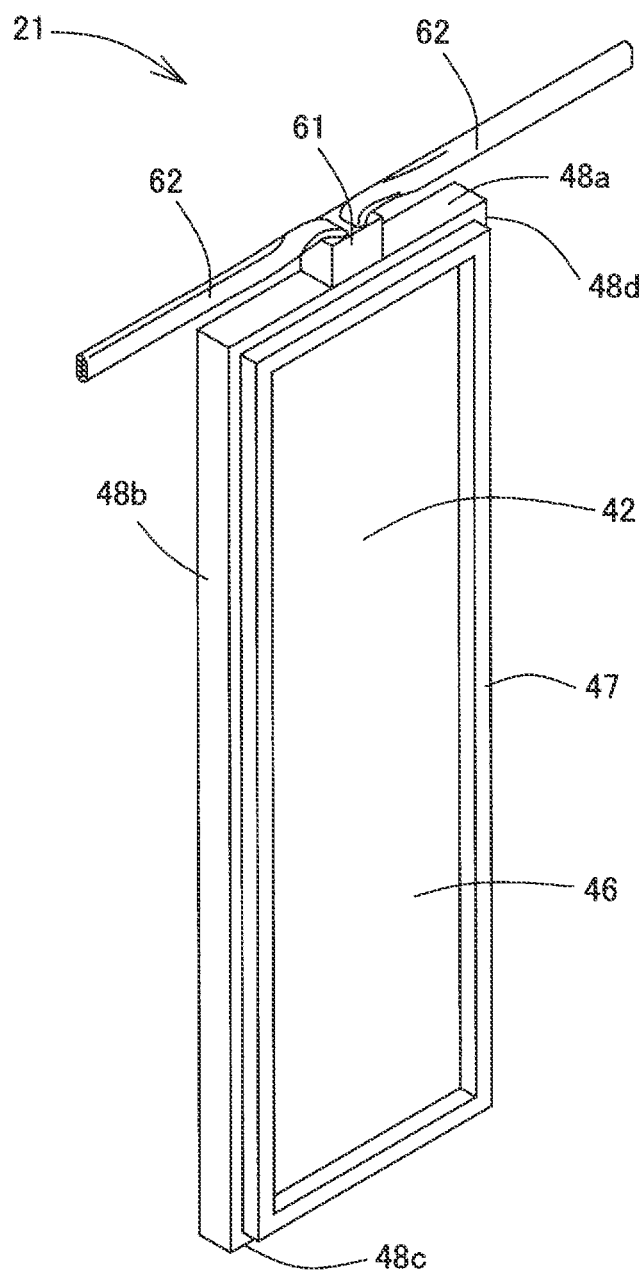
FIG. 9 is a perspective view of a solar cell module of FIG. 8 as viewed from a direction different from that of FIG. 8.

As shown in FIG. 9, a gap forming part 47 (spacing holding member) is provided on the outer main surface 46 of the main body panel 42.

The gap forming part 47 is a part that forms a gap between the inner main surface 32 of the window glass 30 and the outer main surface 46 of the main body panel 42 when the power generation window 16 is formed.

The gap forming part 47 is interposed between the inner main surface 32 of the window glass 30 and the outer main surface 46 of the main body panel 42, and is also the spacing holding part that holds a spacing between the window glass 30 and the main body panel 42.

The gap forming part 47 is a projecting stripe protruding from the outer main surface 46 in a crossing direction (orthogonal direction in the present embodiment) to the outer main surface 46 of the main body panel 42, and has an annular shape and continuously or intermittently extends along the sides 48a to 48d when viewed from the back.

The gap forming part 47 is preferably an elastically deformable elastic body. By doing this, the main body panel 42 and the window glass 30 are not in direct contact with each other, and the window glass 30 is less likely to be damaged during construction.

Figure 10:
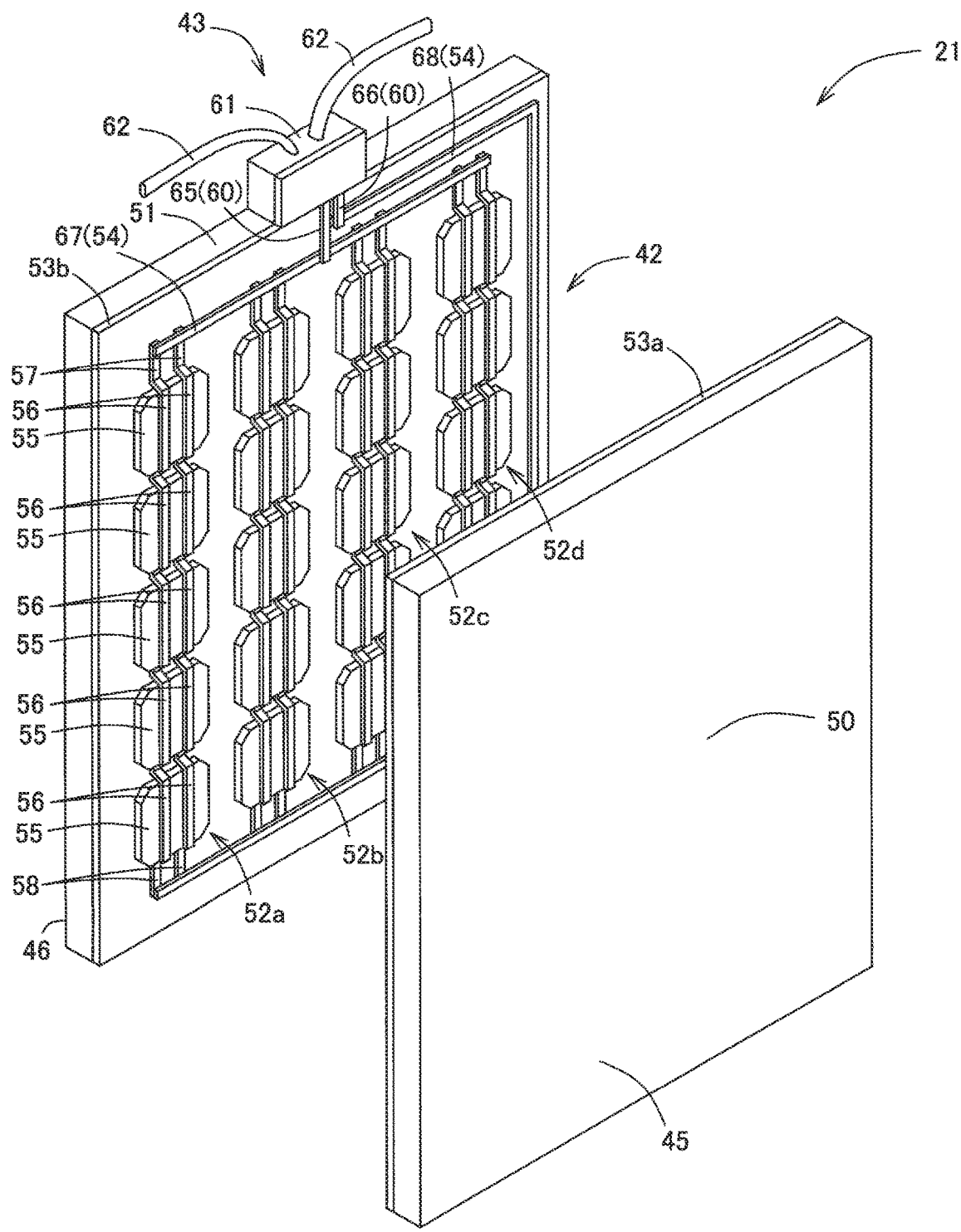
FIG. 10 is an exploded perspective view of the solar cell module of FIG. 4.
Figure 11:
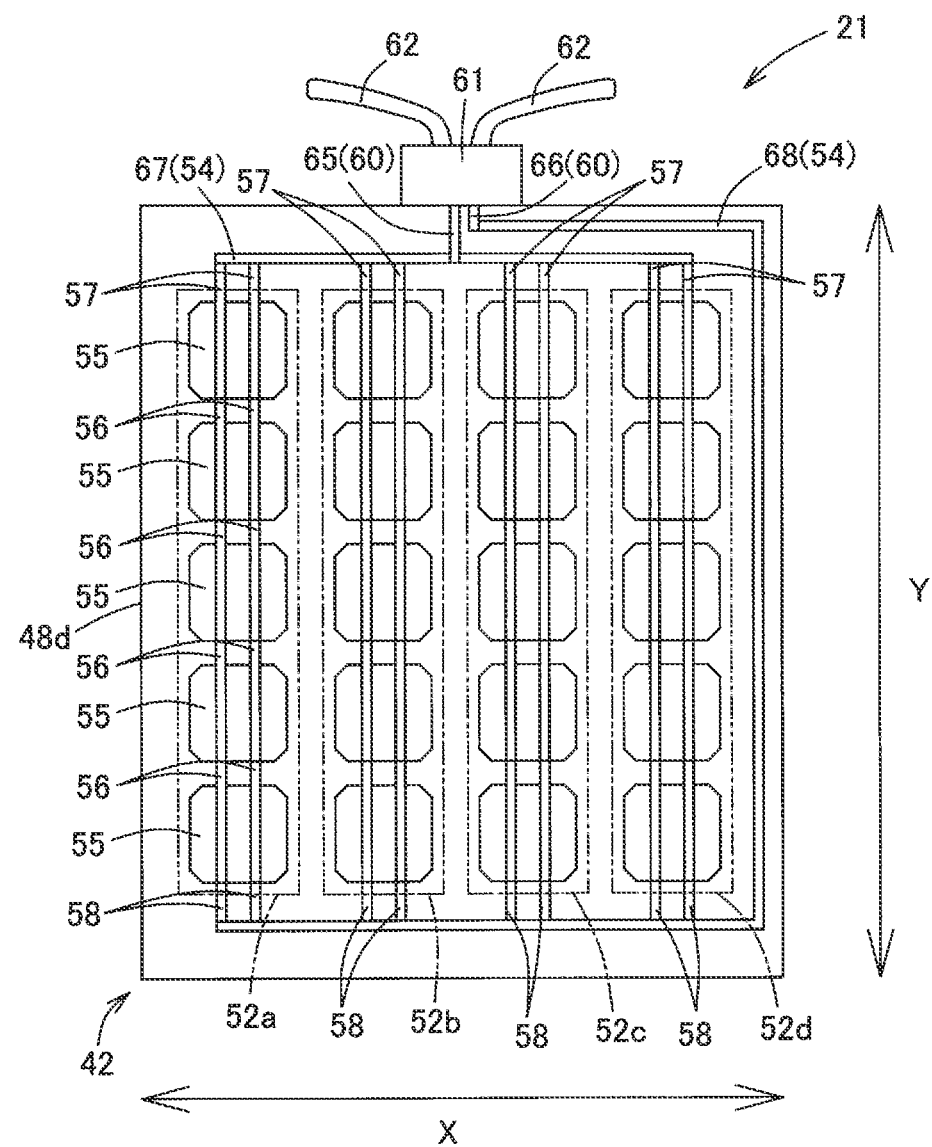
FIG. 11 is a front view of the solar cell module of FIG. 4, in which a translucent substrate and a sealing member on one side are omitted for easy understanding.

As shown in FIGS. 10 and 11, in the main body panel 42, a plurality of solar cell strings 52a to 52d is arranged between two translucent substrates 50 and 51, and sealing members 53a and 53b are filled and sealed between the two translucent substrates 50 and 51.

The main body panel 42 according to the present embodiment is a crystalline silicon solar cell panel, and includes the solar cell strings 52a to 52d and a panel-side wire part 54 electrically connected to the solar cell strings 52a to 52d, as shown in FIGS. 10 and 11.

The translucent substrates 50 and 51 are translucent insulation substrates having translucent properties and insulation properties, and specifically, glass substrates having a thickness of about 1 mm to 5 mm are generally used. In order to reduce a load on the frame 31 of the window glass 30, one of the translucent substrates 50 and 51 which is disposed on the indoor space 6 side may be a translucent resin sheet or resin plate.

As shown in FIG. 10, the solar cell strings 52 are formed by electrically connecting a plurality of solar cells 55 in series via interconnectors 56. That is, the solar cell strings 52 allow electricity to flow in one direction, and ends on an upstream side in a flow direction of the electricity are positive electrode side end parts 57, and ends on a downstream side are negative electrode side end parts 58.

In the solar cell strings 52, electrodes of the solar cells 55 may be in direct contact with each other and may be electrically connected in series without the interconnectors 56.

As shown in FIGS. 10 and 11, the panel-side wire part 54 includes a positive electrode side connecting part 67 and a negative electrode side connecting part 68.

As shown in FIG. 11, the positive electrode side connecting part 67 is a connection wire that is connected to the positive electrode side end parts 57 of the solar cell strings 52a to 52d and electrically connects the solar cell strings 52a to 52d to the inner wire part 60 of the extraction wire 43.

The negative electrode side connecting part 68 is a connection wire that is connected to the negative electrode side end parts 58 of the solar cell strings 52a to 52d and electrically connects the solar cell strings 52a to 52d to the inner wire part 60 of the extraction wire 43.

As shown in FIG. 10, the sealing members 53a and 53b are bonding members that seal the solar cells 55 arranged between the two translucent substrates 50 and 51 and bond the two translucent substrates 50 and 51. Specifically, as the sealing members 53a and 53b, sheets of ethylene-vinyl acetate copolymer (EVA), polyolefin, ionomer, or the like can be used.

The extraction wire 43 is a wire that extracts electricity from the solar cells 55, and includes the inner wire part 60, a terminal box 61, and outer wire parts 62 (wire parts) as shown in FIGS. 10 and 11.

The inner wire part 60 is a wire connected to the solar cell strings 52a to 52d in the main body panel 42, and includes a positive electrode side wire part 65 and a negative electrode side wire part 66.

The positive electrode side wire part 65 is a wire in which one end part (first end part) side is connected to the positive electrode side connecting part 67 of the main body panel 42 and the other end part side is drawn into the terminal box 61.

The negative electrode side wire part 66 is a wire in which one end part (first end part) side is connected to the negative electrode side connecting part 68 of the main body panel 42 and the other end part side is drawn into the terminal box 61.

As shown in FIG. 10, the terminal box 61 is a box-shaped member that draws the inner wire part 60 from the main body panel 42 into the terminal box 61. That is, the terminal box 61 includes a terminal block in a casing part, and is a member that electrically connects the inner wire part 60 to the outer wire part 62 via the terminal block.

The outer wire part 62 is a wire connected to another solar cell module 21 or an external load, and is a cable extending from the terminal box 61 to the outside. Specifically, the outer wire part 62 is a flexible flat cable, is bendable, and is a cable having a cross-sectional shape of which a thickness is thinner than a width.

Here, a positional relationship between the parts of the solar cell module 21 will be described.

As shown in FIG. 11, in the solar cell module 21, the plurality of solar cell strings 52a to 52d is arranged in parallel in a horizontal direction X.

In each of the solar cell strings 52a to 52d, the solar cells 55 are arranged in a vertical direction Y, and the solar cells 55 are connected via the interconnectors 56.

In the solar cell module 21, the power generation parts are the solar cells 55, and the lighting parts are parts between the solar cells 55.

In each of the solar cell strings 52a to 52d, the positive electrode side end parts 57 are connected to the positive electrode side connecting part 67, and the negative electrode side end parts 58 are connected to the negative electrode side connecting part 68. That is, in each of the solar cell strings 52a to 52d, at the time of power generation, the positive electrode side end parts 57 and the negative electrode side end parts 58 are electrically at the same potential by the connecting parts 67 and 68, and are connected in parallel.

Figure 14A:
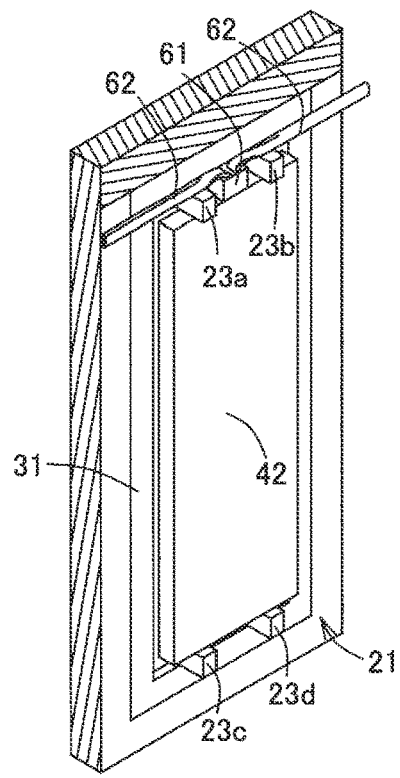
FIGS. 14A and 14B are explanatory diagrams of the assembly procedure of the indoor structure of FIG. 1.
Figure 14B:
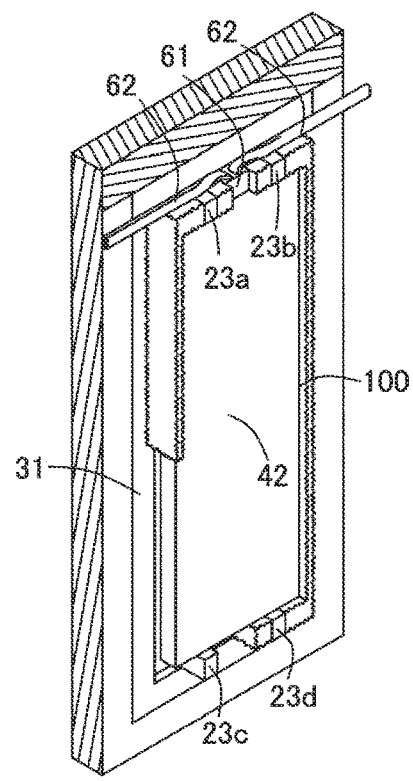

As shown in FIGS. 8 and 14B, the bonding member 22 is a member that bonds the solar cell module 21 to the fitting window 20, and is obtained by curing a liquid adhesive 100.

As shown in FIGS. 5A and 5B, the bonding member 22 can be fixed such that the outer main surface 46 of the main body panel 42 of the solar cell module 21 faces the inner main surface 32 of the window glass 30 of the fitting window 20.

As shown in FIG. 8, holding parts 70a to 70d are formed in the bonding member 22, and can hold four sides 48a to 48d of the main body panel 42.

As shown in FIG. 8, the bonding member 22 includes a box cutout part 71 and positioning cutout parts 72a to 72d.

The box cutout part 71 is a cutout part provided in the upper holding part 70a that holds the upper side 48a of the main body panel 42, and is a cutout part through which the terminal box 61 can be inserted.

The positioning cutout parts 72a and 72b are cutout parts provided in the upper holding part 70a that holds the upper side 48a of the main body panel 42, and are cutout parts through which the positioning members 23a and 23b can be inserted.

The positioning cutout parts 72c and 72d are cutout parts provided in the lower side holding part 70c that holds the lower side 48c of the main body panel 42, and are cutout parts through which the positioning members 23c and 23d can be inserted.

The positioning members 23a to 23d are members for positioning the main body panel 42 when the main body panel 42 is attached to the window glass 30, and can hold the main body panel 42 in the up and down directions.

As shown in FIG. 4, the protective member 25 is a member that protects most of the outer wire parts 62 of the extraction wire 43, and is also a positioning member that fixes positions of the outer wire parts 62. The protective member 25 includes a first cover member 80 and a second cover member 81.

Figure 12A:
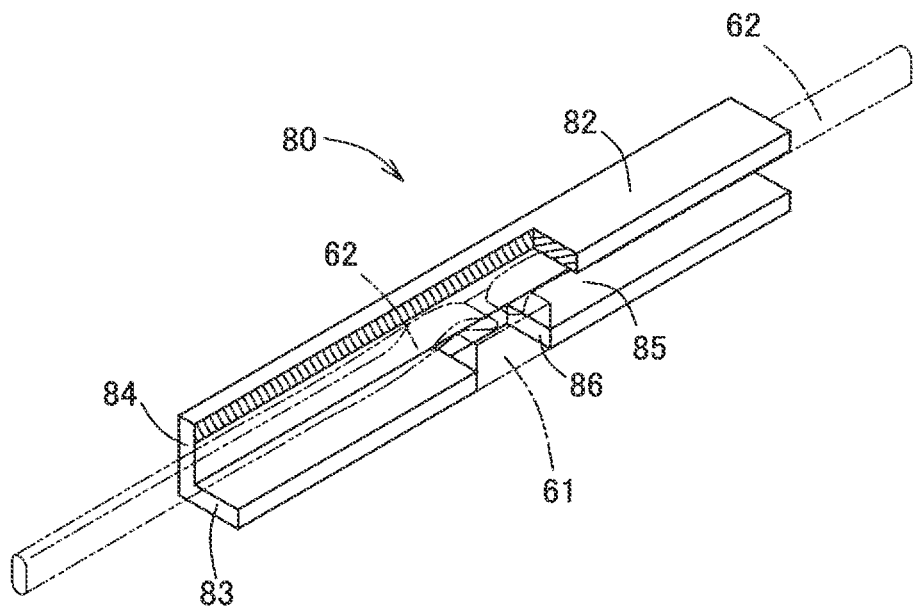
FIGS. 12A and 12B are explanatory diagrams of a protective member of FIG. 4.

As can be seen from FIG. 12A, the first cover member 80 is a protective cover that protects the terminal box 61 and a part of the outer wire part 62.

The first cover member 80 is an elongated member having a substantially U-shaped cross-sectional shape and extending linearly. That is, the first cover member 80 includes wall parts 82 and 83 facing each other with a spacing therebetween, and a connection wall part 84 connecting end parts of the wall parts 82 and 83, and a recessed groove 85 is formed by the wall parts 82 to 84.

The recessed groove 85 is a recessed section having a depth toward the connection wall part 84, and extends linearly in a longitudinal direction.

As illustrated in FIG. 12A, the lower wall part 83 constituting a lower surface of the first cover member 80 includes a cutout part 86 that can pass through the terminal box 61.

The cutout part 86 is a cutout part extending from an end part of the lower wall part 83 toward the connection wall part 84.

An outer surface of the first cover member 80 has substantially the same color as the wall surface constituting part 15 with the inside of the recessed groove 85 as a reference. In the first cover member 80 according to the present embodiment, the wall parts 82 to 84 have the same color as the wall surface constituting part 15.

The term "substantially the same color" mentioned herein includes not only completely the same color but also similar colors. Specifically, when an image is captured by imaging means such as a digital camera and a color of the captured image is classified into 256 gradations of RGB, a difference is 5 gradations or less.

Figure 12B:
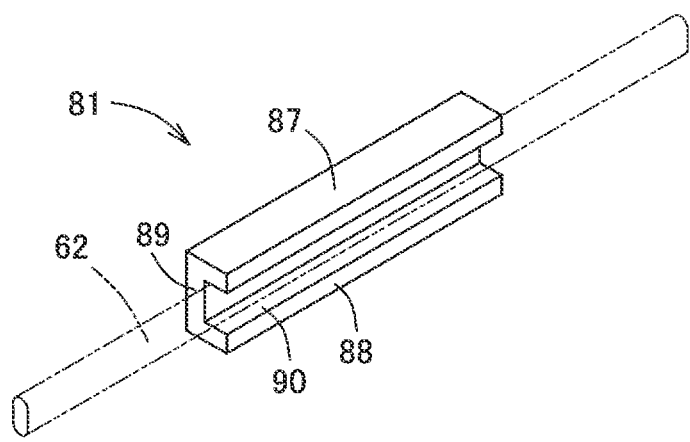

As can be seen from FIG. 12B, the second cover member 81 is a protective cover that protects a part of the outer wire part 62.

The second cover member 81 is an elongated member having a substantially U-shaped sectional shape and extending linearly. That is, the second cover member 81 includes wall parts 87 and 88 facing each other with a spacing therebetween, and a connection wall part 89 connecting end parts of the wall parts 87 and 88, and a recessed groove 90 is formed by the wall parts 87 to 89.

The recessed groove 90 is a recessed section having a depth toward the connection wall part 89, and extends linearly in the longitudinal direction.

An outer surface of the second cover member 81 has substantially the same color as a protrusion side end surface part 96 of the column member 17 with the inside of the recessed groove 90 as a reference. In the first cover member 80 according to the present embodiment, the wall parts 87 to 89 have the same color as the protrusion side end surface part 96 of the column member 17.

As shown in FIG. 1, the column member 17 is a column erected from the floor 5 and extending in the up-down direction from the floor 5 toward the ceiling 2. Specifically, the column member 17 is a through-column that supports the ceiling 2 and is a support column that secures the strength of the wall 3a.

As shown in FIG. 4, the column member 17 protrudes from the wall surface constituting part 15 toward the indoor space 6. The column member 17 includes, as outer surfaces, the protrusion side end surface part 96 and side surface parts 97 and 98 extending from both end parts of the protrusion side end surface part 96 toward the wall surface constituting part 15.

Subsequently, a positional relationship between the members will be described together with a construction procedure of the indoor structure 1 according to the first embodiment of the present invention. The following procedure is an example of the construction procedure, and the present invention is not limited thereto.

Figure 13A:
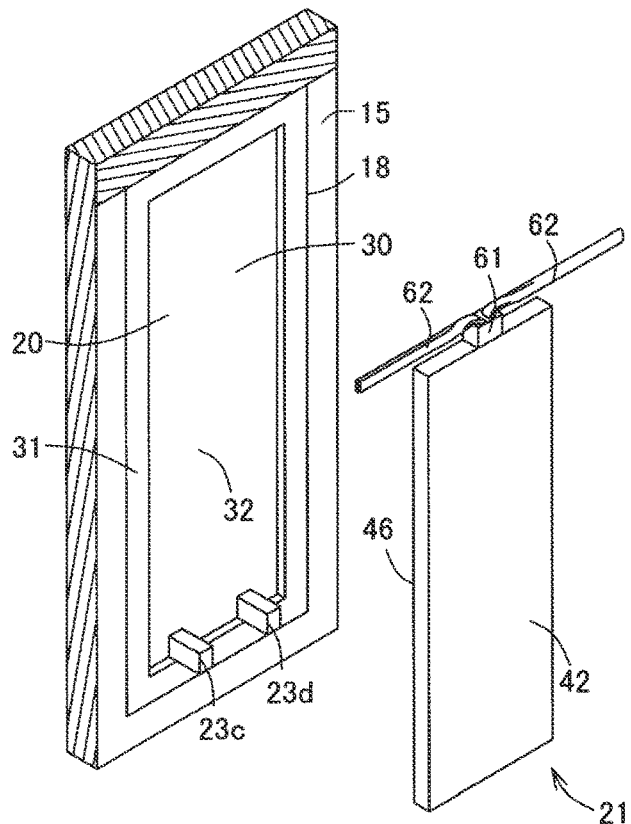
FIGS. 13A and 13B are explanatory diagrams of an assembly procedure of the indoor structure of FIG. 1.
Figure 13B:
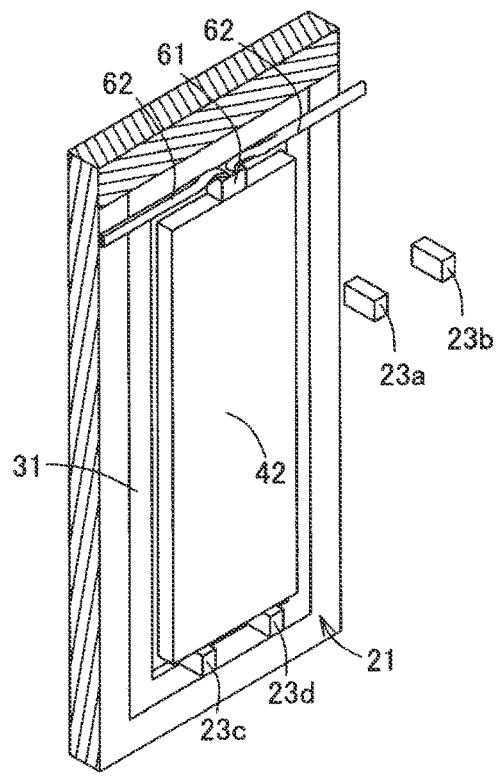

First, as shown in FIG. 13A, the main body panel 42 is overlapped on the fitting window 20 by fixing the positioning members 23c and 23d to a lower part of the frame 31 of the existing fitting window 20 attached to the opening 18 of the wall surface constituting part 15 and mounting the solar cell module 21 on the positioning members 23c and 23d. Then, as shown in FIGS. 13B and 14A, the positioning members 23a and 23b are interposed between an upper end surface of the main body panel 42 of the solar cell module 21 and the frame 31, and thus, the solar cell module 21 is temporarily fixed to the frame 31.

At this time, the gap forming part 47 (see FIG. 9) of the solar cell module 21 abuts on the inner main surface 32 of the window glass 30, and a gap is formed between the inner main surface 32 of the window glass 30 of the fitting window 20 and the outer main surface 46 of the main body panel 42. That is, there is a space between the inner main surface 32 of the window glass 30 and the outer main surface 46 of the main body panel 42, and an air layer is formed.

A spacing D between the inner main surface 32 of the window glass 30 and the outer main surface 46 of the main body panel 42 illustrated in FIGS. 5A and 5B is preferably 5 mm or more and 50 mm or less.

Within this range, the indoor space 6 is hardly compressed by the main body panel 42 while securing heat insulation performance.

Figure 15:
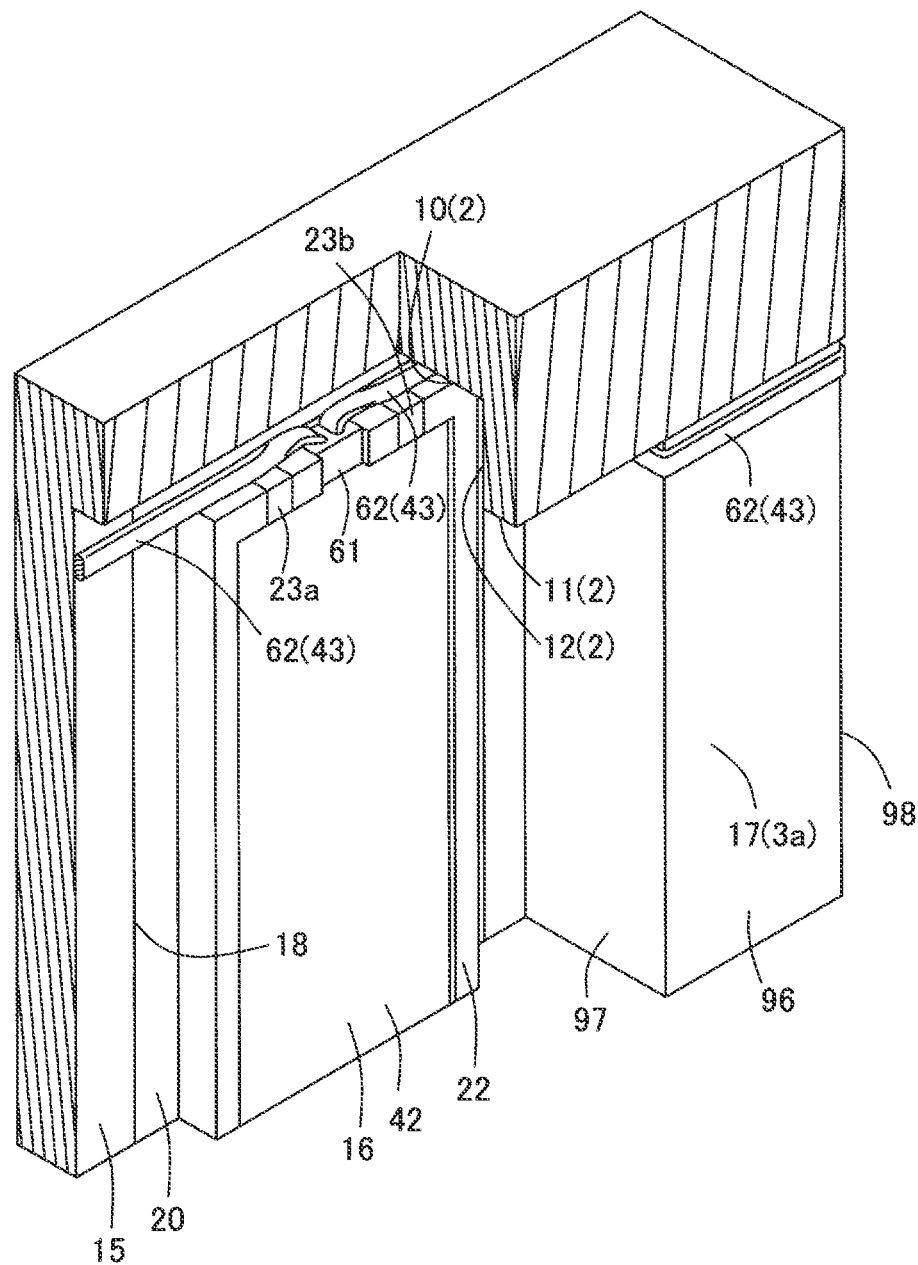
FIG. 15 is an explanatory diagram of the assembly procedure of the indoor structure of FIG. 1, and is a partially broken perspective view illustrating a state in which an outer wire is laid on a ceiling.

At this time, as shown in FIGS. 5A and 5B and 15, in the solar cell module 21, the positioning members 23a and 23b are interposed between an upper end part of the main body panel 42 and the frame 31. In the solar cell module 21, the upper end part of the main body panel 42 is positioned below an upper end part of the fitting window 20, and the terminal box 61 is disposed in a gap between the main body panel 42 and the first ceiling part 10. The terminal box 61 is positioned between the positioning members 23*a* and 23*b* in the width direction W.

Subsequently, in a state in which the solar cell module 21 is temporarily fixed to the fitting window 20 by the positioning members 23*a* to 23*d* as shown in FIG. 14A, a liquid or gel adhesive 100 is applied along the sides 48*a* to 48*d* of the main body panel 42 as shown in FIG. 14B, and the bonding member 22 is formed by curing the adhesive 100. That is, the bonding member 22 is formed along an outer periphery of the main body panel 42, and the main body panel 42 is bonded to the fitting window 20.

At this time, the adhesive 100 is applied across the positioning members 23*a* to 23*d* and the terminal box 61, and the bonding member 22 bonds the positioning members 23*a* to 23*d* and the terminal box 61 to the fitting window 20.

Subsequently, as shown in FIG. 15, the outer wire part 62 is fixed so as to be laid between the vertical wall part 12 of the ceiling 2 and the fitting window 20 such that a thickness direction crosses the first ceiling part 10, and is further fixed along the protrusion side end surface part 96 and the side surface parts 97 and 98 which are the outer surfaces of the column member 17.

At this time, as shown in FIG. 15, the outer wire part 62 is laid from the terminal box 61 on the frame 31 in a space between the main body panel 42 and the first ceiling part 10.

Figure 7:
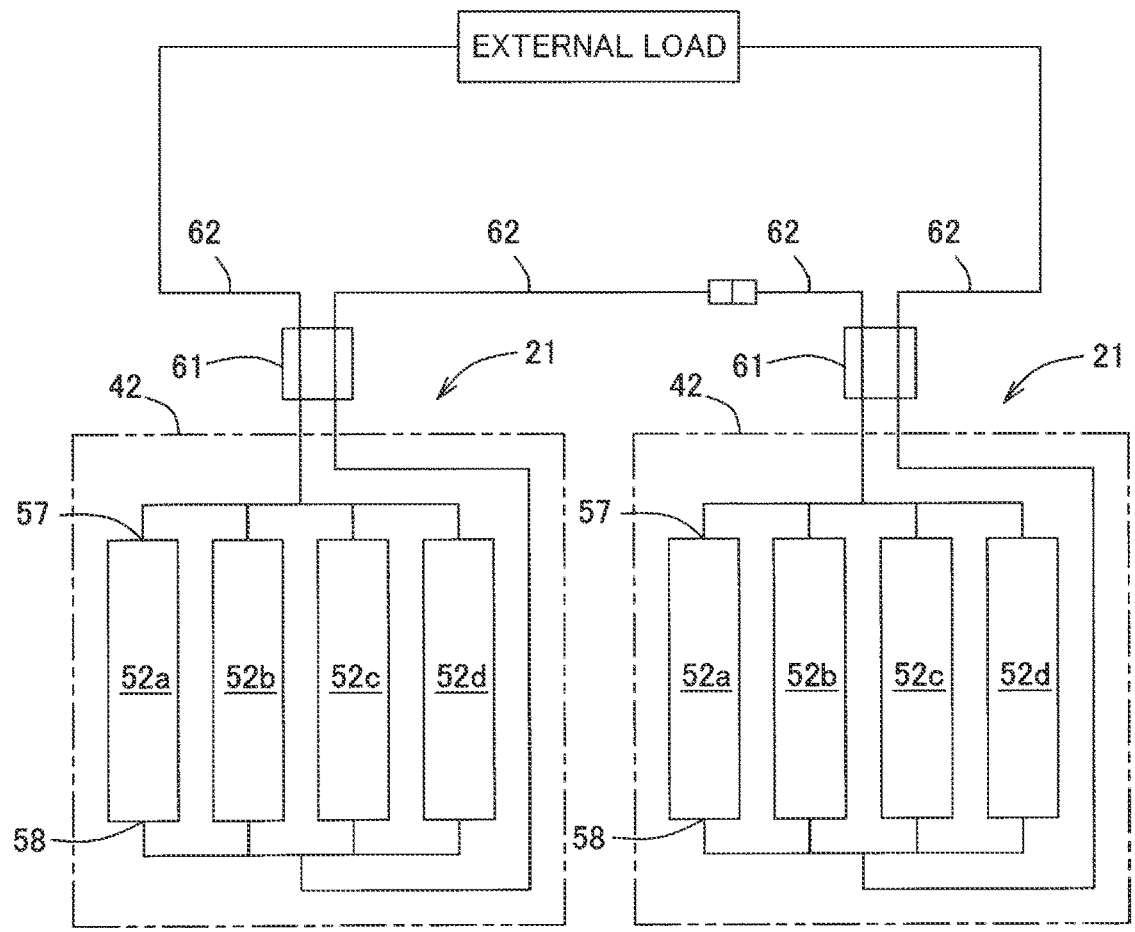
FIG. 7 is an electric circuit diagram of the indoor structure of FIG. 1.

At this time, in the solar cell modules 21 and 21 adjacent to each other with the column member 17 interposed therebetween, the outer wire parts 62 and 62 are connected to each other and are electrically connected in series to an external load as shown in FIG. 7.

Subsequently, as can be seen from FIG. 12A, the first cover member 80 is attached between the main body panel 42 and the first ceiling part 10 such that a part of the outer wire part 62 is accommodated in the recessed groove 85. That is, the first cover member 80 surrounds the outer wire part 62 together with the frame 31 of the fitting window 20, and allows the outer wire part 62 to pass therethrough.

At this time, the first cover member 80 closes the gap between the main body panel 42 and the first ceiling part 10 together with the bonding member 22.

As shown in FIGS. 5A and 5B, the connection wall part 84 of the first cover member 80 forms substantially the same plane as an inner surface of the bonding member 22. That is, the first cover member 80 is substantially flush with the inner surface of the bonding member 22 (surface opposite to the fitting window 20).

The term "substantially flush" mentioned herein means that the step is 5 mm or less.

As shown in FIGS. 8 and 12A, the terminal box 61 passes through the box cutout part 71 of the holding part 70*a* of the bonding member 22 and reaches the inside of the cutout part 86 of the first cover member 80.

As can be seen from FIGS. 3 and 12B, in a separate process, the second cover member 81 is attached to the protrusion side end surface part 96 of the column member 17 such that a part of the outer wire part 62 is accommodated in the recessed groove 90. That is, the second cover member 81 surrounds the outer wire part 62 together with the protrusion side end surface part 96, and allows the outer wire part 62 to pass therethrough.

As described above, in accordance with the indoor structure 1 according to the present embodiment, the outer wire parts 62 are accommodated in the recessed grooves 85 and 90 of the cover members 80 and 81, and are surrounded at a plurality of locations by the frame 31, the first cover member 80, the protrusion side end surface part 96 of the column member 17, and the second cover member 81. Thus, the outer wire part 62 is hardly visible from the indoor space 6 side, and the design is high.

In accordance with the indoor structure 1 according to the present embodiment, since an exposed part of the outer wire part 62 from the main body panel 42 is laid between the vertical wall part 12 of the ceiling 2 and the fitting window 20, a part of the outer wire part 62 is hidden by the vertical wall part 12, and the outer wire part 62 is hardly visible from the indoor space 6 side.

In accordance with the indoor structure 1 according to the present embodiment, since there is a space between the inner main surface 32 of the window glass 30 and the outer main surface 46 of the main body panel 42, heat can be insulated by air, and a heat insulating effect can be further exhibited.

Next, an indoor structure according to a second embodiment of the present invention will be described.

In the indoor structure according to the second embodiment of the present invention, a shape of the solar cell module is different from that of the first embodiment, the inner wire part and the outer wire part are integrated without the terminal box, and the terminal box is not provided.

Figure 16:
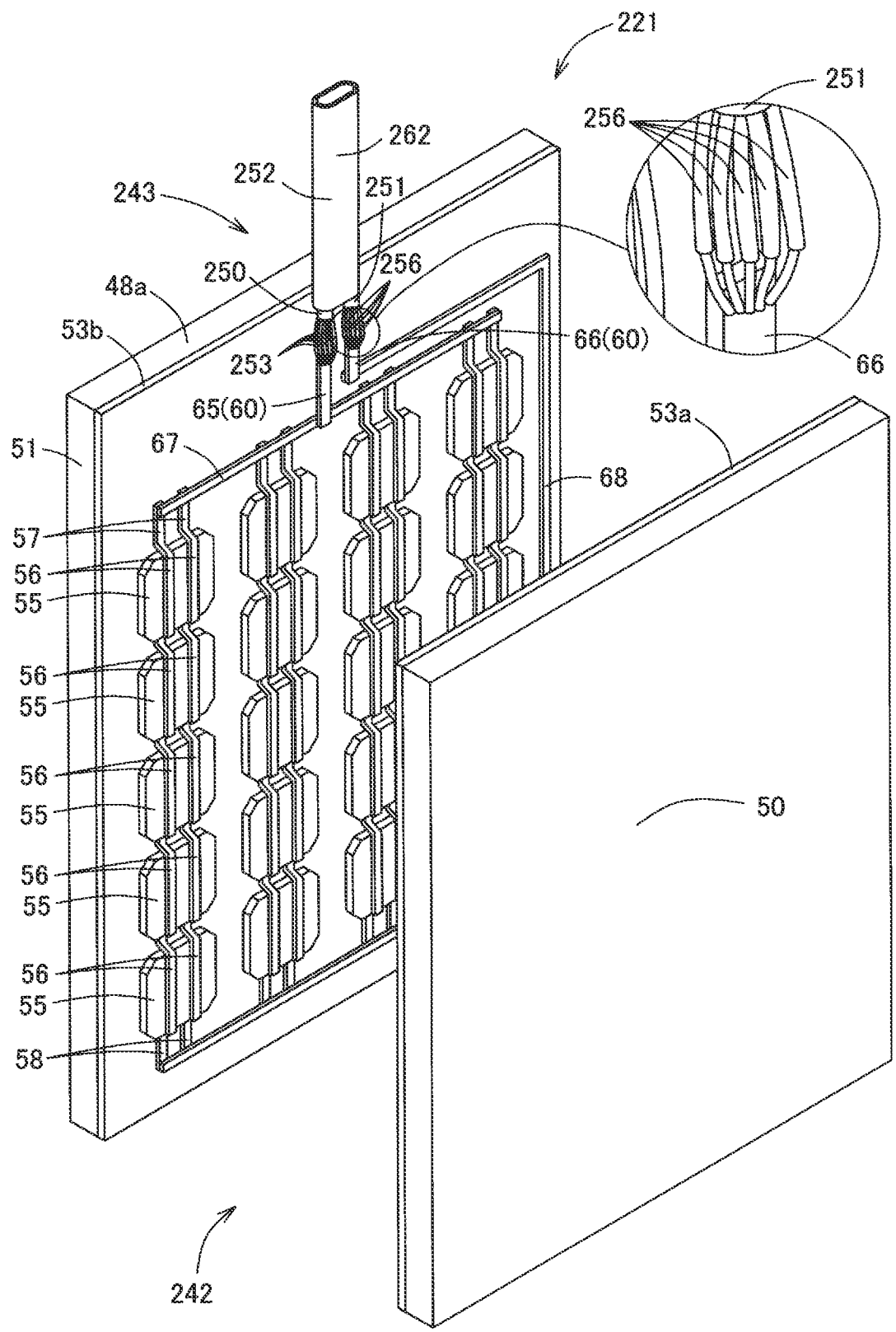
FIG. 16 is an exploded perspective view of a solar cell module according to a second embodiment of the present invention.
Figure 17:
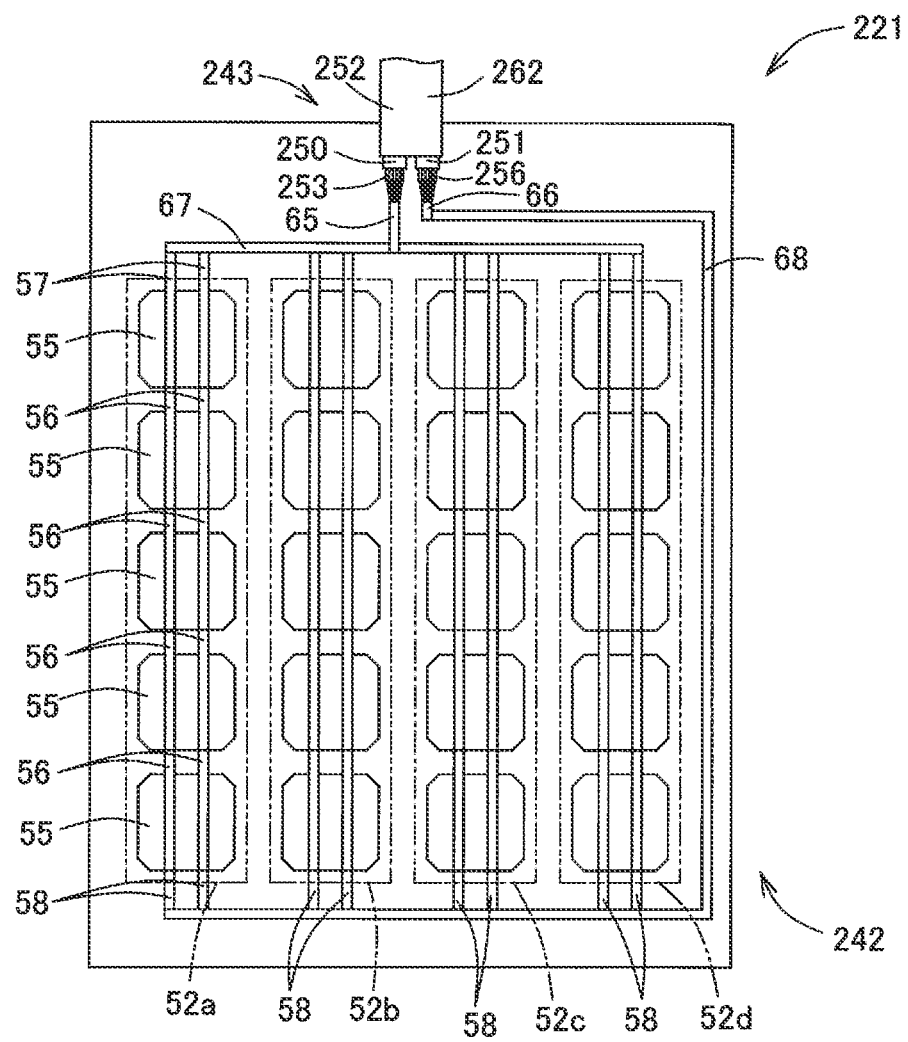
FIG. 17 is a front view of the solar cell module of FIG. 16, in which a translucent substrate and a sealing member on one side are omitted for easy understanding.

As shown in FIGS. 16 and 17, a solar cell module 221 according to the second embodiment includes a main body panel 242 and an extraction wire 243.

Similarly to the main body panel 42 according to the first embodiment, in the main body panel 242, a plurality of solar cell strings 52*a* to 52*d* is arranged between two translucent substrates 50 and 51, and sealing members 53*a* and 53*b* are filled and sealed between the two translucent substrates 50 and 51.

As illustrated in FIGS. 16 and 17, the extraction wire 243 includes an inner wire part 60 and an outer wire part 262.

The outer wire part 262 is bendable, is a cable having a cross-sectional shape of which a thickness is thinner than a width, and includes a positive electrode side cable 250 (second wire part) and a negative electrode side cable 251 (second wire part). The periphery of the cables 250 and 251 is covered with a protective cover 252.

The positive electrode side cable 250 is a multicore cable, and is obtained by bundling a plurality of conductive wires 253 (conductors) and covering the periphery of the conductive wires 253 with an insulator.

The negative electrode side cable 251 is a multicore cable, and is obtained by bundling a plurality of conductive wires 256 (conductors) and covering the periphery of the conductive wires 256 with an insulator.

Next, a positional relationship between the members of the solar cell module 221 according to the second embodiment will be described.

As can be seen from FIGS. 16 and 17, the extraction wire 243 is provided over the inside and the outside between the translucent substrates 50 and 51, and a part of the outer wire part 262 enters between the sealing members 53*a* and 53*b* and is positioned between the translucent substrates 50 and 51. That is, a part of the outer wire part 262 is inserted into the main body panel 242, the conductive wires 253 of the positive electrode side cable 250 are connected to the positive electrode side wire part 65 of the inner wire part 60 inside the main body panel 242, and the conductive wires 256 of the negative electrode side cable 251 are connected to the negative electrode side wire part 66 of the inner wire part 60. From another point of view, the outer wire part 262 is connected to the wire parts 65 and 66 inside the main body panel 242, and protrudes to the outside from between the sealing members 53a and 53b.

When the translucent substrates 50 and 51 are viewed from the front, the outer wire part 262 extends between the inside and the outside at an intermediate part of one side of the translucent substrates 50 and 51.

The term "intermediate part" mentioned herein refers to a part between both end parts in one direction, and refers to a part other than both the end parts.

A thickness direction of the outer wire part 262 coincides with an overlapping direction of the two translucent substrates 50 and 51 at least at edge parts of the translucent substrates 50 and 51 (side parts when viewed from the front). That is, a width of the outer wire part 262 extends in a spreading direction of a boundary surface between the translucent substrates 50 and 51.

In accordance with the indoor structure according to the second embodiment, since the terminal box is not provided in the solar cell module 221, cost can be reduced.

In accordance with the indoor structure according to the second embodiment, since the positive electrode side cable 250 and the negative electrode side cable 251 are formed by bundling the plurality of conductive wires 253 and 256, disconnection or the like hardly occurs.

In the above-described second embodiment, although the extraction wire 243 is provided on the upper side 48a of the main body panel 242, and a part for extracting electricity from the main body panel 242 is concentrated in one location, the present invention is not limited thereto. A plurality of parts for extracting electricity may be provided.

Figure 18:
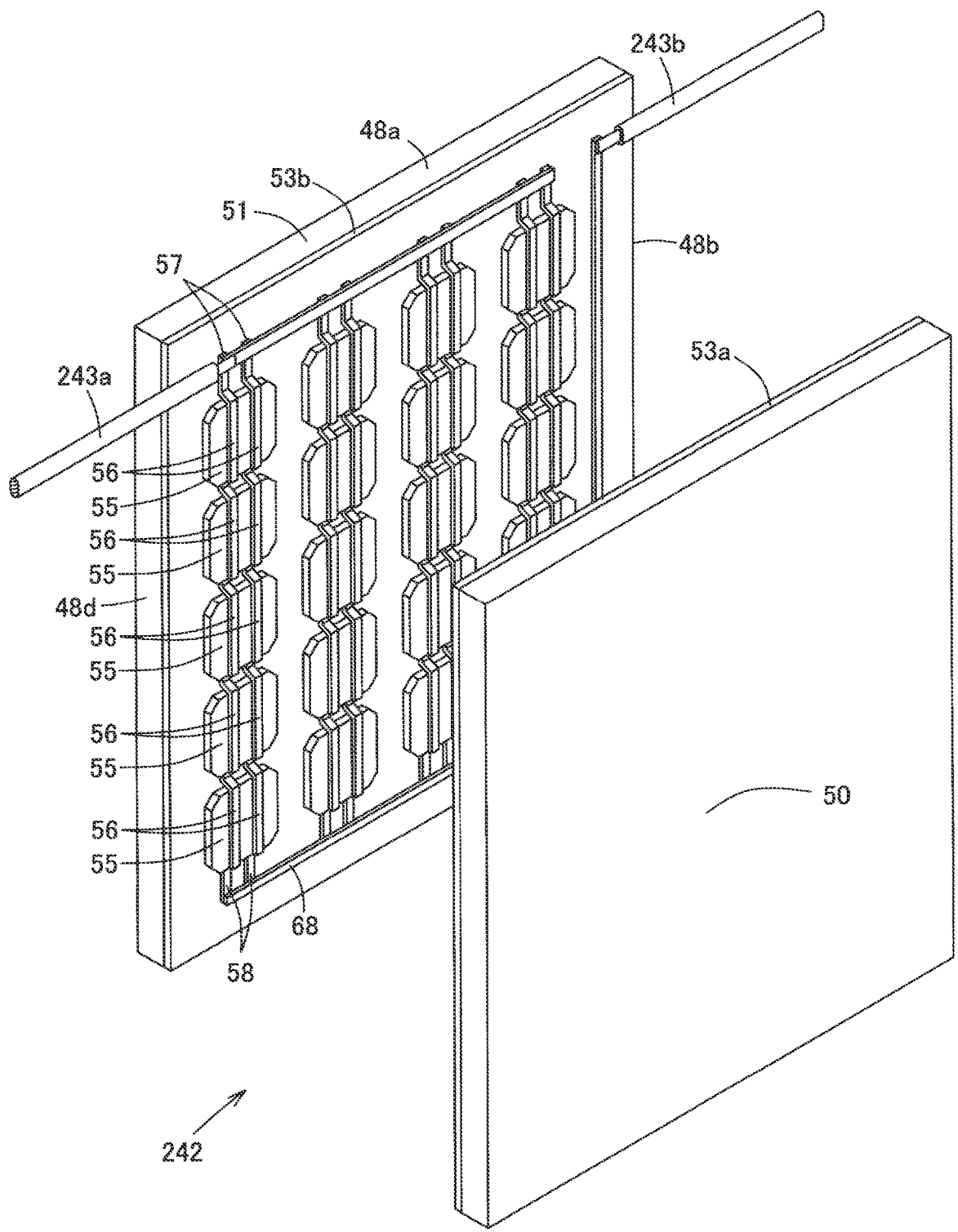
FIG. 18 is an exploded perspective view of a solar cell module according to another embodiment of the present invention.

For example, as shown in FIG. 18, an extraction wire 243a connected to the positive electrode side end parts 57 may be provided from one of the left and right sides 48d of the main body panel 42, and an extraction wire 243b connected to the negative electrode side end parts 58 may be provided from the other side 48b.

In the above-described embodiments, although the main body panel 42 or 242 is the crystalline silicon solar cell panel and the solar cell strings 52 are formed by connecting the solar cells 55 via the interconnectors 56, the present invention is not limited thereto. The solar cell strings 52 of the main body panel 42 or 242 may be formed by directly connecting the solar cells 55 in series without the interconnectors 56 similar to the case of using a thin film solar panel.

In the above-described embodiments, the extraction wire 43 or 243 is provided on the upper side 48a of the main body panel 42 or 242. However, the present invention is not limited thereto. The extraction wire 43 or 243 may be provided on the other sides 48b to 48d of the main body panel 42 or 242.

In the above-described embodiments, the first cover member 80 is attached to the frame 31 of the fitting window 20. However, the present invention is not limited thereto. The first cover member 80 is attached is not particularly limited. For example, the first cover member 80 may be attached to the first ceiling part 10. Or the first cover member 80 may be attached to the solar cell module 21.

In the above-described second embodiment, although the positive electrode side cable 250 and the negative electrode side cable 251 of the extraction wire 243 are multicore cables, respectively, the present invention is not limited thereto. The positive electrode side cable 250 and the negative electrode side cable 251 may be single-core cables.

In the above-described embodiments, although the positioning members 23a to 23d are provided on the inner main surface of the window glass 30, the present invention is not limited thereto. As long as the spacing between the inner main surface 32 of the window glass 30 and the outer main surface 46 of the main body panel 42 can be maintained, the window glass may be provided on the frame 31.

In the above-described embodiments, the spacing between the inner main surface 32 of the window glass 30 and the outer main surface 46 of the main body panel 42 is maintained by providing the gap forming part 47 on the outer main surface 46 of the main body panel 42. However, the present invention is not limited thereto. The spacing between the inner main surface 32 of the window glass 30 and the outer main surface 46 of the main body panel 42 may be maintained by providing the gap forming part in the window glass 30.

Figure 19:
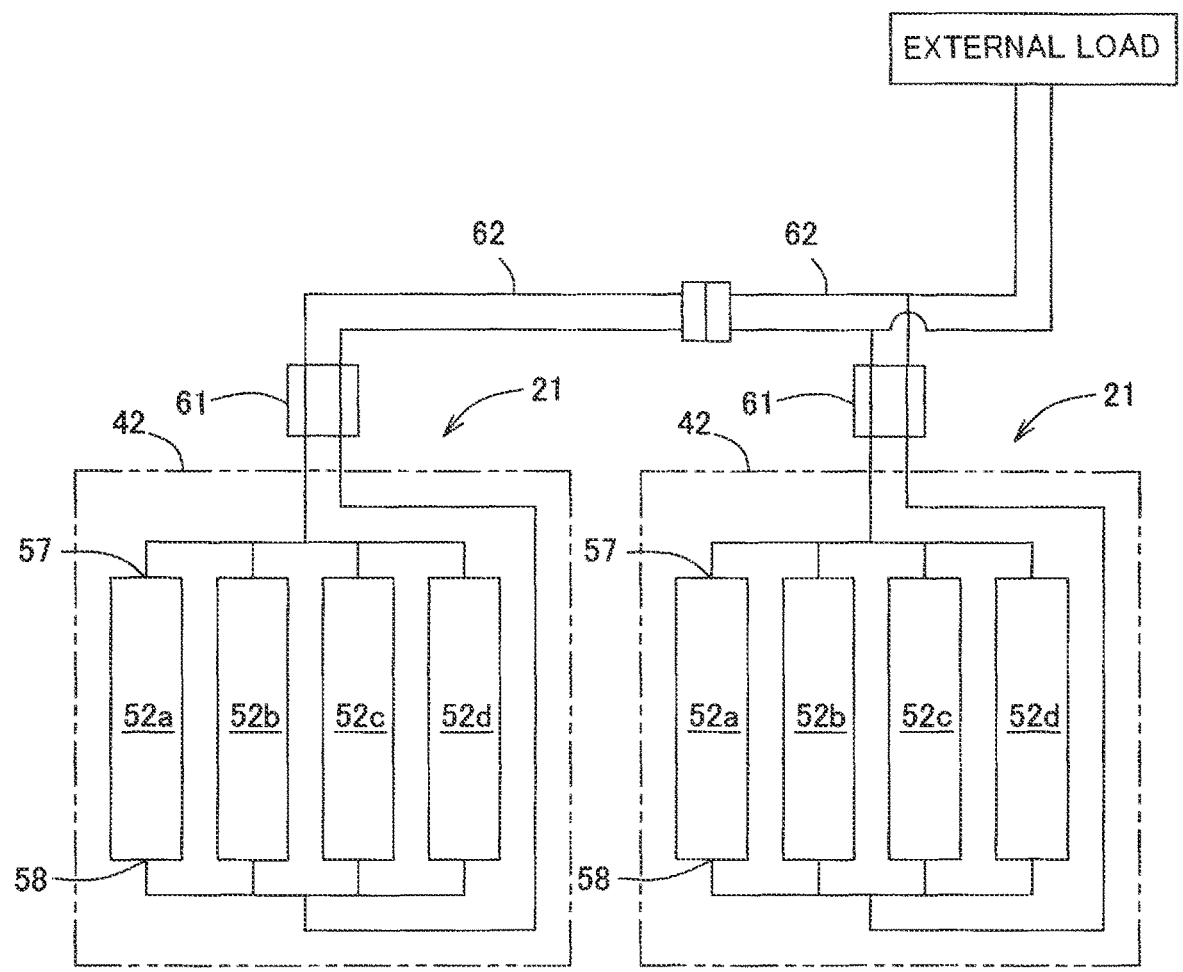
FIG. 19 is an electric circuit diagram of an indoor structure according to another embodiment of the present invention.

In the above-described embodiments, the solar cell modules 21 and 21 adjacent to each other with the column member 17 interposed therebetween are electrically connected in series to the external load. However, the present invention is not limited thereto. The solar cell modules 21 and 21 adjacent to each other with the column member 17 interposed therebetween may be electrically connected in parallel to the external load as shown in FIG. 19.

In the above-described embodiments, the solar cell module 21 is fitted into the opening 18 of the wall 3a and is attached to the substantially non-detachable fitting window 20. However, the present invention is not limited thereto. The solar cell module may be attached to a window detachable from the opening 18 of the wall 3a.

In the above-described embodiments, the solar cell module 21 is mounted on the positioning members 23c and 23d and then the positioning members 23a and 23b are inserted into the gap between the solar cell module 21 and the frame 31 to perform positioning. However, the present invention is not limited thereto. The positioning members 23a to 23d may be installed on the frame 31, and then the solar cell module 21 may be installed.

Figure 20:
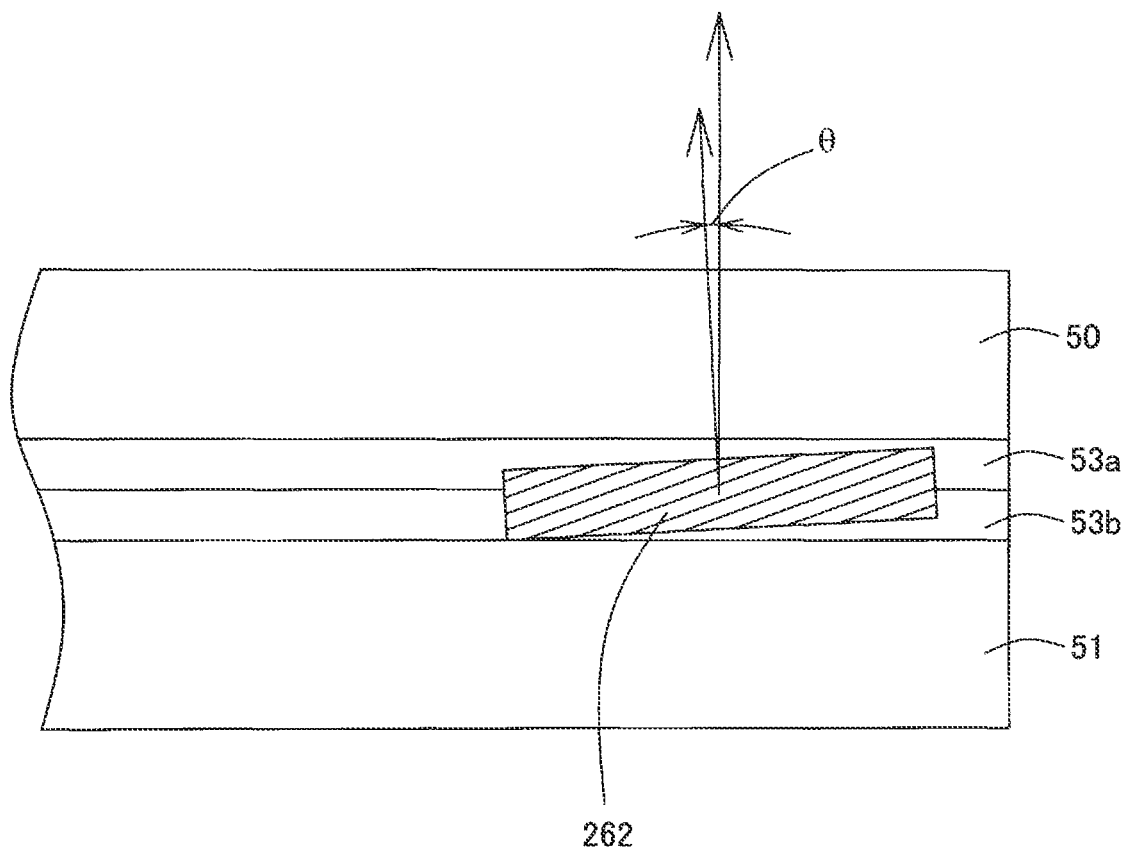
FIG. 20 is a side view illustrating the vicinity of an end part of the solar cell module according to another embodiment of the present invention.

In the above-described second embodiment, the thickness direction of the outer wire part 262 coincides with the overlapping direction of the two translucent substrates 50 and 51. However, the present invention is not limited thereto. The thickness direction of the outer wire part 262 may be inclined with respect to the overlapping direction of the two translucent substrates 50 and 51 to such an extent that the thickness direction substantially is regarded as coinciding with the overlapping direction of the two translucent substrates 50 and 51. For example, as shown in FIG. 20, in the solar cell module, at least in the edge parts of the translucent substrates 50 and 51, an absolute value of an inclination angle θ in the thickness direction of the wire part with respect to the overlapping direction of the two translucent substrates 50 and 51 may be 0 degrees or more and 3 degrees or less. The absolute value of the inclination angle θ is preferably 1 degree or less, and more preferably 0.2 degrees or less.

In the above-described embodiments, the constituting members can be freely replaced or added between the embodiments as long as the replacement or addition is included in the technical scope of the present invention.

EXPLANATION OF REFERENCE SIGNS

1: indoor structure
2: ceiling
5: floor

10: first ceiling part
11: second ceiling part
12: vertical wall part
17: column member
20: fitting window
21,221: solar cell module
23a~23d: positioning member
25: protective member
30: window glass
32: inner main surface (one main surface of window glass, window main surface)
42,242: main body panel
43,243: extraction wire
46: outer main surface (one main surface of main body panel, panel main surface)
47: gap forming part (spacing maintaining member)
50,51: translucent substrate
52,52a~52d: solar cell string
55: solar cell
57: positive electrode side end part
58: negative electrode side end part
60: inner wire part
61: terminal box
62,262: outer wire part (wire part)
67: positive electrode side connecting part
68: negative electrode side connecting part
80: first cover member
81: second cover member
85,90: recessed groove (recessed section)
250: positive electrode side cable (second wire part)
251: negative electrode side cable (second wire part)
253,256: conductive wire (conductor)

The invention claimed is:

1. An indoor structure provided in a room having an indoor space, comprising:
   at least one solar cell module attached to at least one window disposed along at least one wall between a ceiling and a floor,
   wherein the ceiling, the at least one wall, and the floor define the indoor space of the room,
   wherein the ceiling comprises a first ceiling part and a second ceiling part, the second ceiling part being located lower than the first ceiling part, the second ceiling part being continuous with the first ceiling part via a vertical wall part, the vertical wall part is a part of the ceiling connecting a first end part of the first ceiling part and a second end part of the second ceiling part,
   the at least one window includes a window glass having a window main surface,
   the at least one solar cell module comprises a main body panel and an extraction wire,
   the main body panel comprises two translucent substrates and a plurality of solar cells arranged therebetween, the main body panel being configured to transmit light in a thickness direction of the main body panel,
   the main body panel includes a panel main surface facing the window main surface,
   the extraction wire extends inside and outside the main body panel, the extraction wire including a first end part,
   the first end part is electrically connected to the plurality of solar cells inside the main body panel,
   the extraction wire includes a wire part exposed from the main body panel, and
   the wire part is laid between the vertical wall part and the at least one window.

2. The indoor structure according to claim 1, wherein the wire part has a thickness thinner than a width and is laid between the vertical wall part and the at least one window so that a thickness direction crosses the first ceiling part.

3. The indoor structure according to claim 1, wherein a spacing holding member is provided between the window main surface and the panel main surface, and a spacing between the window main surface and the panel main surface is 5 mm or more and 50 mm or less.

4. The indoor structure according to claim 1, wherein the main body panel comprises a positive electrode side connecting part, a negative electrode side connecting part, and the plurality of the solar cells electrically connected in series forming a plurality of solar cell strings,
   the positive electrode side connecting part is electrically connected to positive electrode side end parts of the plurality of solar cell strings,
   the negative electrode side connecting part is electrically connected to negative electrode side end parts of the plurality of solar cell strings,
   the extraction wire comprises a positive electrode side wire part and a negative electrode side wire part at the first end part, and
   between the two translucent substrates, the positive electrode side wire part is connected to the positive electrode side connecting part, and the negative electrode side wire part is connected to the negative electrode side connecting part.

5. The indoor structure according to claim 4, wherein the extraction wire comprises a second wire part including the positive electrode side wire part and the negative electrode side wire part, and
   the second wire part is composed of bundled conductors.

6. The indoor structure according to claim 1, further comprising a cover member with a recessed section, wherein
   the cover member is attached to at least one attachment target selected from the group consisting of the at least one window, the first ceiling part, and the main body panel, and
   the recessed section surrounds the wire part together with the at least one attachment target.

7. The indoor structure according to claim 6, wherein the at least one solar cell module includes a terminal box to which the wire part is connected, and
   the cover member includes the terminal box therein.

8. The indoor structure according to claim 1, wherein the wire part has a thickness thinner than a width, a part of the wire part being inserted into the main body panel, and
   a thickness direction of the wire part substantially coincides with an overlapping direction of the two translucent substrates inside the main body panel.

9. The indoor structure according to claim 1, wherein the at least one window includes a first window and a second window,
   the at least one solar cell module includes a first solar cell module and a second solar cell module, and
   the indoor structure further comprises:
   a column member positioned between the first and second windows; and
   a cover member with a recessed section,
   wherein the first solar cell module and the second solar cell module are arranged such that first and second panel main surfaces face first and second window main surfaces, respectively, the first and second solar cell modules are electrically connected by first and second extraction wires, respectively, first and second wire parts are disposed along first and second outer surfaces of the column member, respectively, and the cover member includes a first part and a second part of the first and second wire parts in the recessed section, respectively.

10. The indoor structure according to claim 9, wherein the column member is a column that extends from the floor to the ceiling and supports the ceiling.

11. An indoor structure provided in a room having an indoor space, comprising:

first and second windows arranged along at least one wall between a ceiling and a floor, wherein the ceiling, the at least one wall, and the floor define the indoor space of the room, wherein the ceiling comprises a first ceiling part and a second ceiling part, the second ceiling part being located lower than the first ceiling part, the second ceiling part being continuous with the first ceiling part via a vertical wall part, the vertical wall part is a part of the ceiling connecting a first end part of the first ceiling part and a second end part of the second ceiling part;

a column member positioned between the first and second windows, the column member extending from the floor to the ceiling and supports the ceiling;

first and second solar cell modules; and a cover member with a recessed section, wherein the first and second windows include first and second window glasses having first and second window main surfaces, respectively, the first and second solar cell modules include first and second main body panels with first and second panel main surfaces, and first and second extraction wires, respectively, the first and second panel main surfaces of the first and second main body panels are configured to face the first and second window main surfaces, respectively, the first and second solar cell modules are electrically connected by the first and second extraction wires, respectively, the first and second extraction wires include first and second wire parts exposed from the first and second main body panels, respectively, the first and second wire parts extend along first and second outer surfaces of the column member, respectively, and the cover member is attached to the column member and the second ceiling part, and the cover member includes the first and second wire parts in the recessed section.

* * * * *